(12) United States Patent
Godo et al.

(10) Patent No.: US 7,554,265 B2
(45) Date of Patent: Jun. 30, 2009

(54) DISPLAY DEVICE

(75) Inventors: Hiromichi Godo, Atsugi (JP); Tomoe Matsubara, Hachiouji (JP); Masayuki Sakakura, Ebina (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 467 days.

(21) Appl. No.: 11/159,351

(22) Filed: Jun. 23, 2005

(65) Prior Publication Data

US 2005/0285516 A1 Dec. 29, 2005

(30) Foreign Application Priority Data

Jun. 25, 2004 (JP) ............... 2004-188827

(51) Int. Cl.
*H01J 1/62* (2006.01)
*H01J 63/04* (2006.01)

(52) U.S. Cl. .............. 313/506; 313/504; 359/580; 359/586

(58) Field of Classification Search ......... 313/498–512; 359/580–590
See application file for complete search history.

(56) References Cited

U.S. PATENT DOCUMENTS

| | | | |
|---|---|---|---|
| 4,505,547 A * | 3/1985 | Sekimura | 349/137 |
| 5,815,223 A * | 9/1998 | Watanabe et al. | 349/42 |
| 5,952,708 A | 9/1999 | Yamazaki | |
| 6,169,293 B1 | 1/2001 | Yamazaki | |
| 6,239,470 B1 | 5/2001 | Yamazaki | |
| 6,384,886 B2 | 5/2002 | Yamazaki et al. | |
| 6,493,052 B1 | 12/2002 | Satake et al. | |
| 6,800,875 B1 | 10/2004 | Yamazaki | |
| 6,831,409 B2 | 12/2004 | Yamada | |
| 6,867,434 B2 | 3/2005 | Yamazaki | |
| 7,361,931 B2 | 4/2008 | Yamazaki | |
| 2001/0020821 A1 * | 9/2001 | Cottaar | 313/635 |
| 2002/0153831 A1 * | 10/2002 | Sakakura et al. | 313/504 |

FOREIGN PATENT DOCUMENTS

| | | |
|---|---|---|
| CN | 1399166 | 2/2003 |
| JP | 2002-367770 | 12/2002 |
| JP | 2003-133062 | 5/2003 |

OTHER PUBLICATIONS

Office Action (Application No. 200510080932.2) dated Jun. 6, 2008.

* cited by examiner

*Primary Examiner*—Nimeshkumar D Patel
*Assistant Examiner*—Thomas A Hollweg
(74) *Attorney, Agent, or Firm*—Eric J. Robinson; Robinson Intellectual Property Law Office, P.C.

(57) ABSTRACT

An active matrix display device which can easily improve the viewing angle characteristics. In the active matrix display device where light is emitted in the direction of a substrate over which thin film transistors are formed, when focusing on the multiple interference caused by the light emitted from a light-emitting element, which is reflected on the film used for forming the thin film transistors, effect on the multiple interference can be drastically reduced by forming the reflecting film to have the substantial optical thickness of $\lambda/2$, without losing the function of the thin film transistor.

42 Claims, 16 Drawing Sheets

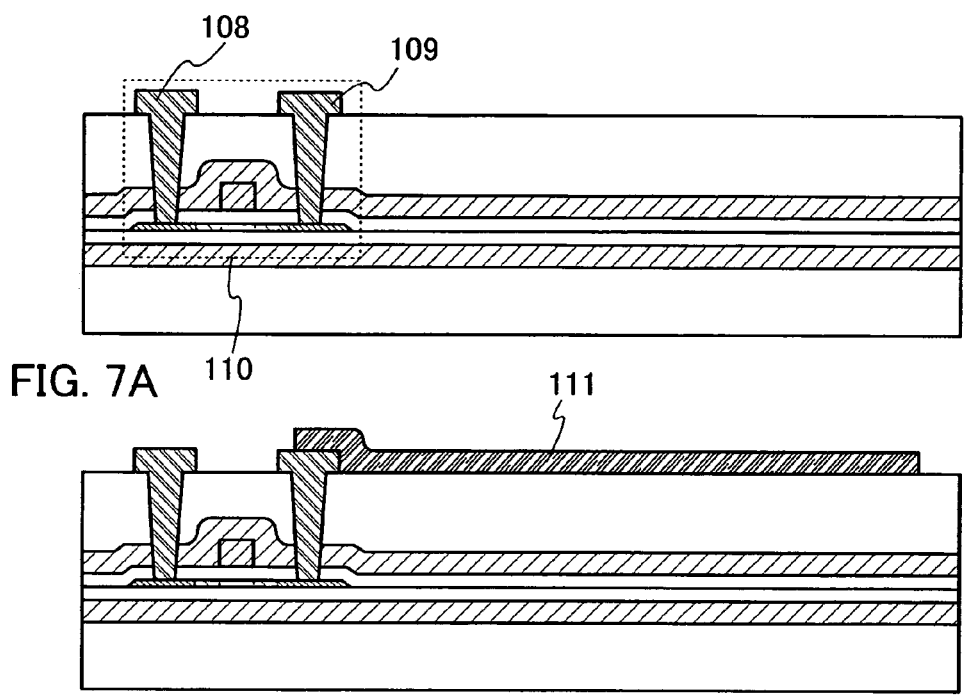
FIG. 7A
FIG. 7B
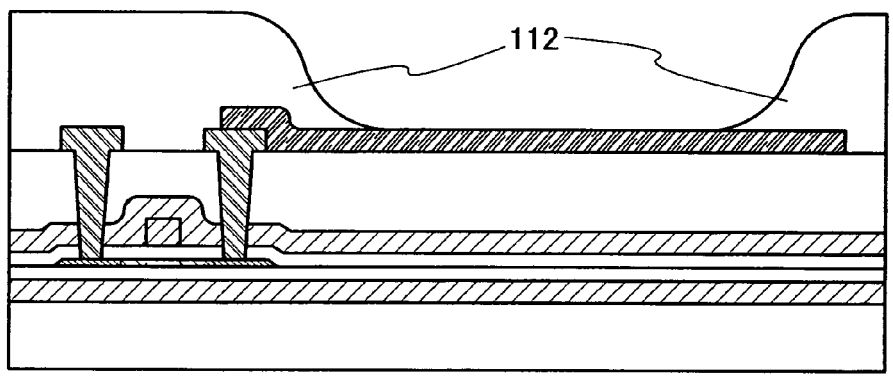
FIG. 7C
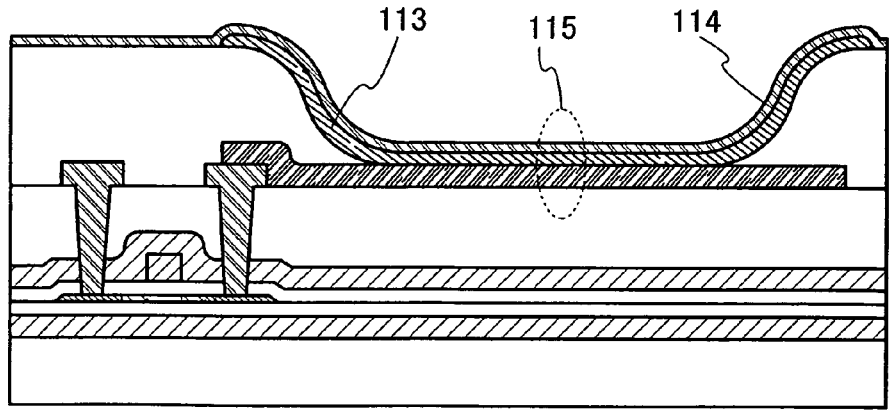
FIG. 7D

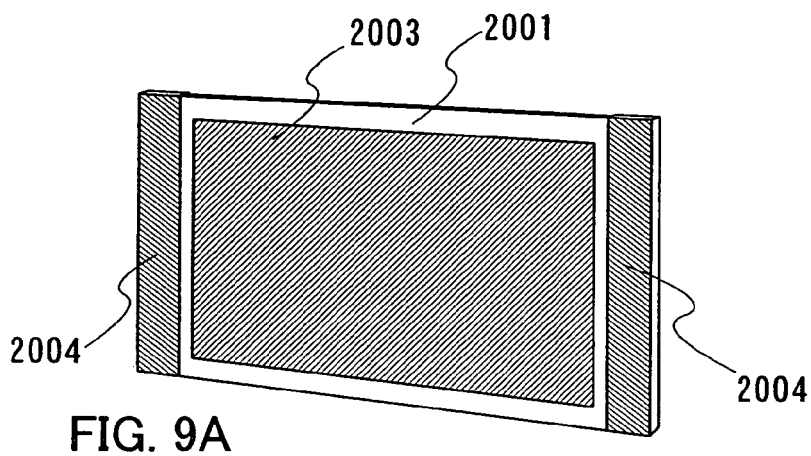
FIG. 9A
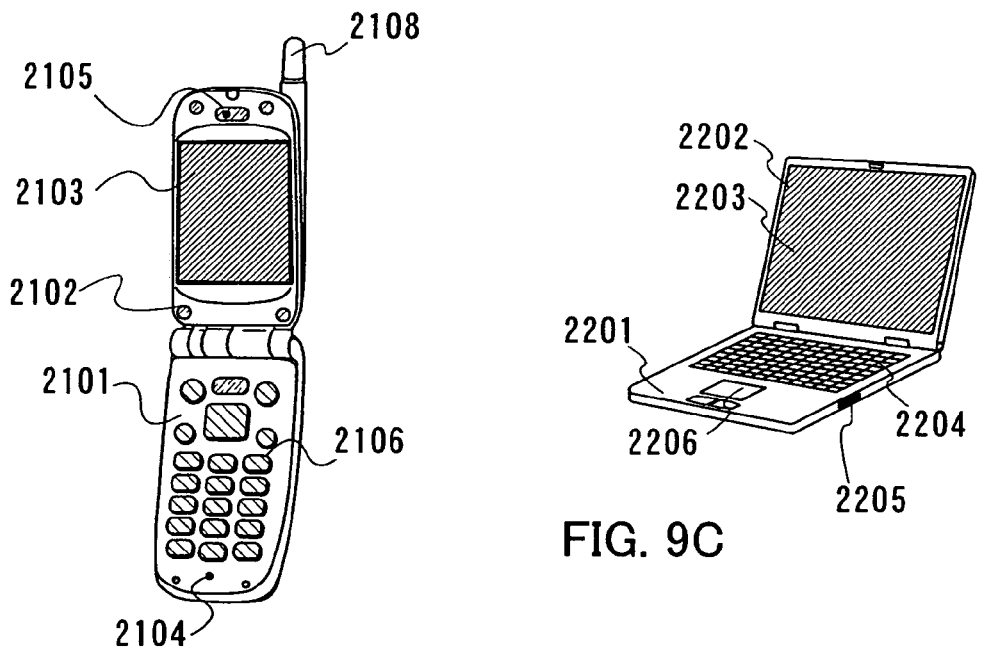
FIG. 9B
FIG. 9C
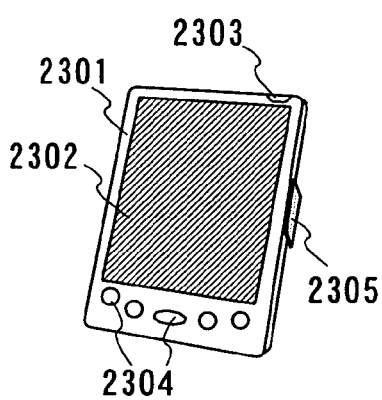
FIG. 9D
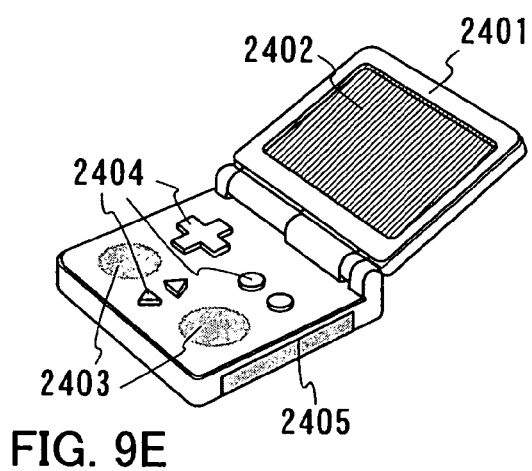
FIG. 9E

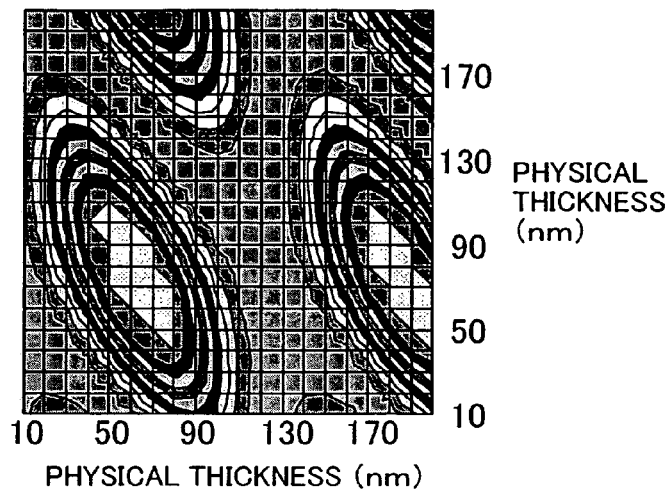
FIG. 12A  λ=450nm
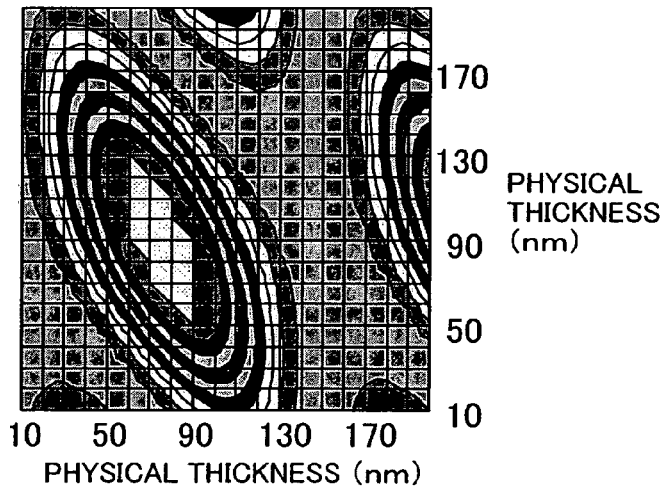
FIG. 12B  λ=540nm
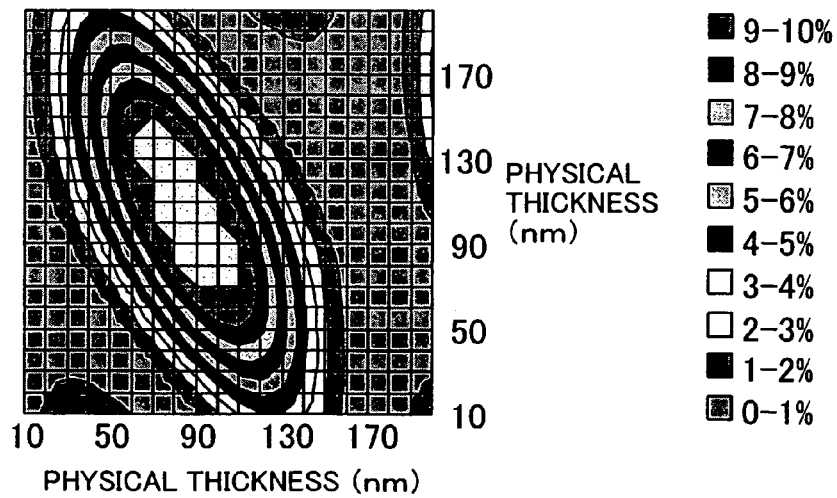
FIG. 12C  λ=620nm

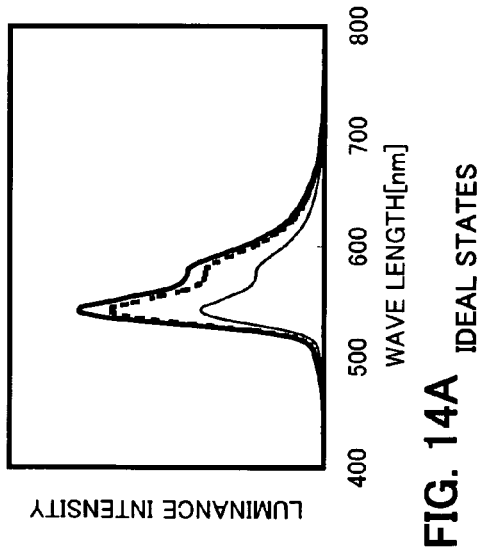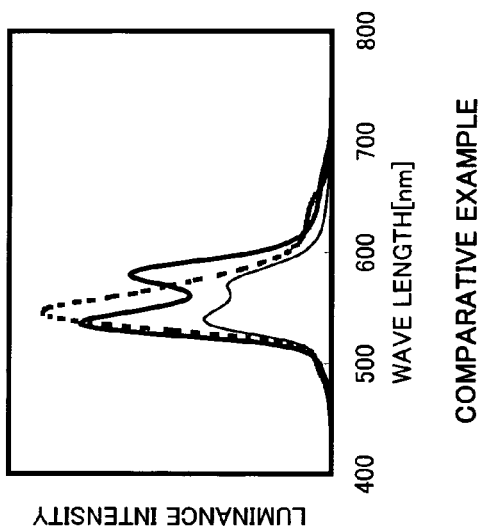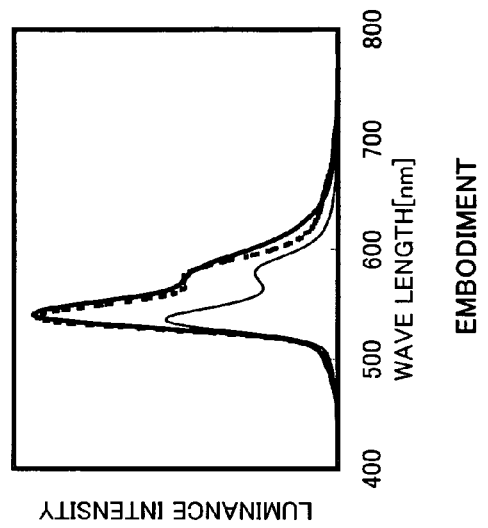
FIG. 14A
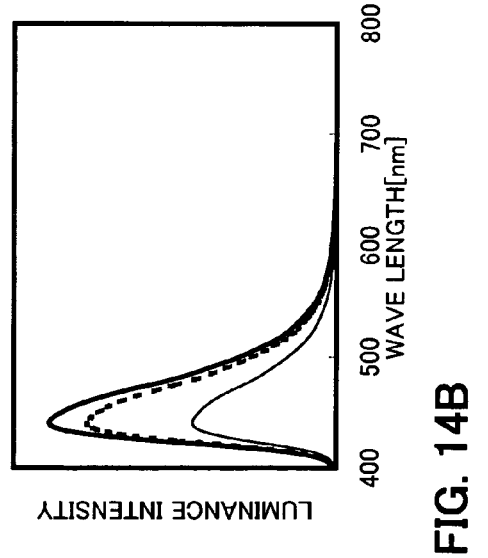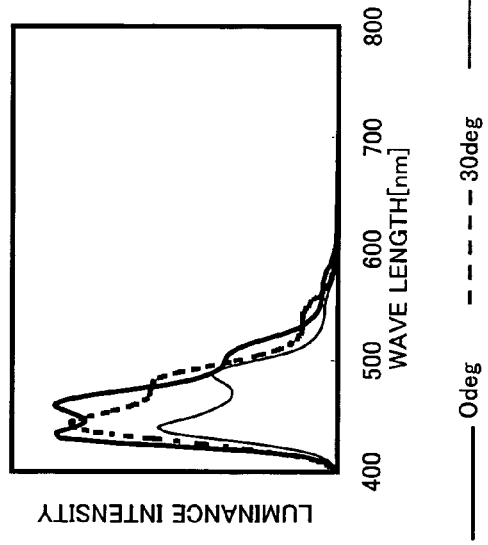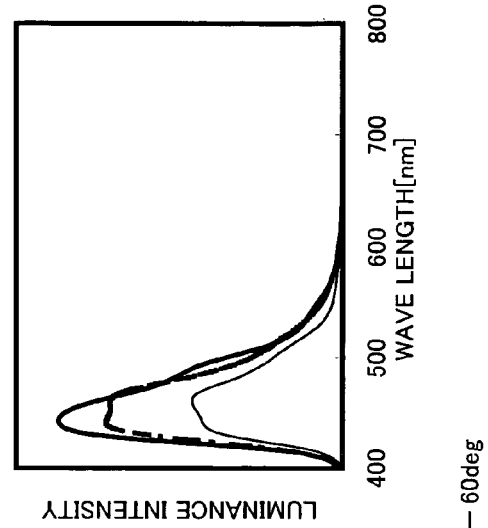
FIG. 14B
———— 0deg   — — — 30deg   —·—·— 60deg

DISPLAY DEVICE

BACKGROUND OF THE INVENTION

1. Field of the Invention

The present invention relates to a display device, and more particularly to a self-light-emitting display device having the improved viewing angle characteristics.

2. Description of the Related Art

A light-emitting device which uses light emission from electroluminescence elements (light-emitting elements) has been attracting attention as a display device with a wide viewing angle and low power consumption.

As a driving method of the light-emitting device which is mainly used for image display, there are an active matrix driving method and a passive matrix driving method. As for the light-emitting device using the active matrix driving method, emission/non-emission or the like of a light-emitting element can be controlled in each pixel. Therefore; it can be driven with lower power consumption than the passive matrix light-emitting device. Thus, the light-emitting device can be suitably mounted as a display portion of a compact electronic appliance such as a portable phone as well as a display portion of a large-screen television receiver set and the like.

In the active matrix light-emitting device, a circuit for controlling the drive of each light-emitting element is provided for each light-emitting element. The circuit and the light-emitting element are provided over a substrate so that the light emitted outside is not blocked by the circuit. In addition, in the portion overlapping the light-emitting element, light-transmissive insulating films are provided in stacked layers, through which light travels to be emitted outside. Such insulating films are provided for forming a circuit element such as a transistor and a capacitor as a main circuit component, or a wiring.

When light travels through the stacked insulating films, there might be a case where light reflected on the interface between each layer interferes with each other (called multiple interference) due to the difference in refraction factor of each insulating film. As a result, emission spectrum changes dependently on the angle seen from the emission side, leading to the inferior viewing angle characteristics.

For example, Patent Document 1 discloses a light-emitting device which is proposed in response to a problem that the visibility and the viewing angle characteristics degrade due to the difference in refraction factor of each layer, through which light emitted from a light-emitting element travels. The light-emitting device can avoid such a problem by defining the relationship of refraction factors between each layer.

[Patent Document 1]

Japanese Patent Laid-Open No. 2003-133062

Patent Document 2 discloses a light-emitting element as a display element, which is proposed in response to a problem that the viewing angle characteristics degrade in a light-emitting element having a resonance structure which is constituted by electrodes and a light-emitting layer. The light-emitting element can solve such a problem by improving the resonance structure.

[Patent Document 2]

Japanese Patent Laid-Open No. 2002-367770

However, in the structure of Patent Document 1, it is quite difficult to select materials which can satisfy both the desired refraction factor and the function of each layer such as an insulating property and a passivation property since the refraction factor is an intrinsic value to each material.

In addition, in the structure of Patent Document 2, only a light-emitting element is focused on, which is constituted by opposed electrodes and an organic layer interposed between them. Therefore, there is a possibility that the degradation of the viewing angle characteristics cannot be sufficiently suppressed in a light-emitting device such as an active matrix light-emitting device where light is emitted outside through a plurality of layers in addition to the light-emitting element.

SUMMARY OF THE INVENTION

In view of the foregoing, it is a primary object of the invention to provide an active matrix display device which can easily improve the viewing angle characteristics.

In order to solve the aforementioned problem, the invention provides a display device having a substrate over which thin film transistors and light-emitting elements are formed. Between the substrate and the light-emitting elements, an optically plurality of layers are formed, which include sequentially stacked layers of a layer having a refraction factor: $n1$, a layer having a refraction factor: $n2$, and a layer having a refraction factor: $n3$. The $n1$, $n2$ and $n3$ satisfy the relationship such that $n1<n2>n3$ or $n1>n2<n3$, and the optical thickness of the layer having the refraction factor of $n2$ is substantially equal to the integral multiple of $\lambda/2$ on the assumption that the center wavelength of the light emitted from the light-emitting element is $\lambda$.

A display device of the invention for solving the aforementioned problem comprises a first base insulating film formed over a light-transmissive substrate, a second base insulating film formed over the first base insulating film, and a thin film transistor including a semiconductor layer, a gate insulating film, and a gate electrode, which is formed over the second base insulating film. In addition, the display device of the invention comprises a first insulating film formed covering the thin film transistor, a second insulating film formed covering the first insulating film, a wiring formed over the second insulating film and electrically connected to the semiconductor layer through a contact hole, and a light-emitting element electrically connected to the wiring. An electrode of the light-emitting element on the substrate side transmits light, the first base insulating film is formed of a material having a larger or smaller refraction factor than the substrate and the films in contact with the first base insulating film, and the first insulating film is formed of a material having a larger or smaller refraction factor than the films in contact with the first insulating film. In addition, on the assumption that the center wavelength of the light emitted from the light-emitting element is $\lambda$, each optical thickness of the first base insulating film and the first insulating film is substantially equal to the integral multiple of $\lambda/2$.

A display device of the invention for solving the aforementioned problem comprises a first base insulating film formed over a light-transmissive substrate, a second base insulating film formed over the first base insulating film, and a thin film transistor including a semiconductor layer, a gate insulating film, and a gate electrode, which is formed over the second base insulating film. In addition, the display device of the invention comprises a first insulating film formed covering the thin film transistor, a second insulating film formed covering the first insulating film, a wiring formed over the second insulating film and electrically connected to the semiconductor layer through a contact hole, and a light-emitting element electrically connected to the wiring. An electrode of the light-emitting element on the substrate side transmits light, the first base insulating film is formed of a material having a larger or smaller refraction factor than the substrate and the films in contact with the first base insulating film, and the first insulating film is formed of a material having a larger or smaller refraction factor than the films in contact with the first insulating film. In addition, on the assumption that the center wavelength of the light emitted from the light-emitting element is λ, the total optical thickness of the second base insulating film and the gate insulating film is L1, each optical thickness of the first base insulating film and the first insulating film is L2, and m is an integer not less than 1, L1=−L2+(2m−1)λ/4 is substantially satisfied.

A display device of the invention for solving the aforementioned problem comprises a first base insulating film formed over a light-transmissive substrate, a second base insulating film formed over the first base insulating film, and a thin film transistor including a semiconductor layer, a gate insulating film, and a gate electrode, which is formed over the second base insulating film. In addition, the display device of the invention comprises a first insulating film formed covering the thin film transistor, a second insulating film formed covering the first insulating film, a wiring electrically connected to the semiconductor layer through a contact hole, and a light-emitting element electrically connected to the wiring. An electrode of the light-emitting element on the substrate side transmits light, and each of the first base insulating film and the first insulating film is formed of a material containing silicon nitride as its main component while each of the second base insulating film and the gate insulating film is formed of a material containing silicon oxide as its main component. In addition, the physical thickness of the first base insulating film is in the range of 120 to 162 nm, the physical thickness of the first insulating film is in the range of 120 to 162 nm, and the total physical thickness of the gate insulating film and the second base insulating film is in the range of 132 to 198 nm.

A display device of the invention for solving the aforementioned problem comprises a first base insulating film formed over a light-transmissive substrate, a second base insulating film formed over the first base insulating film, and a thin film transistor including a semiconductor layer, a gate insulating film, and a gate electrode, which is formed over the second base insulating film. In addition, the display device of the invention comprises an insulating film formed covering the thin film transistor, a wiring formed over the insulating film and electrically connected to the semiconductor layer through a contact hole, and a light-emitting element electrically connected to the wiring. An electrode of the light-emitting element on the substrate side transmits light, and the first base insulating film is formed of a material having a larger or smaller refraction factor than the substrate and the films in contact with the first base insulating film. In addition, on the assumption that the center wavelength of the light emitted from the light-emitting element is λ, the optical thickness of first base insulating film is substantially equal to the integral multiple of λ/2.

A display device of the invention for solving the aforementioned problem comprises a base insulating film formed over a substrate, and a thin film transistor including a semiconductor layer, a gate insulating film, and a gate electrode, which is formed over the base insulating film. In addition, the display device of the invention comprises a first insulating film formed covering the thin film transistor, a second insulating film formed covering the first insulating film, a wiring formed over the second insulating film and electrically connected to the semiconductor layer through a contact hole, and a light-emitting element electrically connected to the wiring. An electrode of the light-emitting element on the substrate side transmits light, the base insulating film is formed of a material having a larger or smaller refraction factor than the substrate and the films in contact with the base insulating film, and the first insulating film is formed of a material having a larger or smaller refraction factor than the films in contact with the first insulating film. In addition, on the assumption that the center wavelength of the light emitted from the light-emitting element is λ each optical thickness of base insulating film and the first insulating film is substantially equal to the integral multiple of λ/2.

A display device of the invention for solving the aforementioned problem comprises a base insulating film formed over a substrate, and a thin film transistor including a semiconductor layer, a gate insulating film, and a gate electrode, which is formed over the base insulating film. In addition, the display device of the invention comprises an insulating film formed covering the thin film transistor, a wiring formed over the insulating film and electrically connected to the semiconductor layer through a contact hole, and a light-emitting element electrically connected to the wiring. An electrode of the light-emitting element on the substrate side transmits light, and the base insulating film is formed of a material having a larger or smaller refraction factor than the substrate and the films in contact with the base insulating film. In addition, on the assumption that the center wavelength of the light emitted from the light-emitting element is λ, the optical thickness of the base insulating film is substantially equal to the integral multiple of λ/2.

A display device of the invention for solving the aforementioned problem comprises a base insulating film formed over a substrate, and a thin film transistor including a semiconductor layer, a gate insulating film, and a gate electrode, which is formed over the base insulating film. In addition, the display device of the invention comprises a first insulating film formed covering the thin film transistor, a second insulating film formed covering the first insulating film, a wiring formed over the second insulating film and electrically connected to the semiconductor layer through a contact hole, and a light-emitting element electrically connected to the wiring. An electrode of the light-emitting element on the substrate side transmits light, and the first insulating film is formed of a material having a larger or smaller refraction factor than the films in contact with the first insulating film. In addition, on the assumption that the center wavelength of the light emitted from the light-emitting element is λ, the optical thickness of the first insulating film is substantially equal to the integral multiple of λ/2.

A display device of the invention for solving the aforementioned problem comprises a first base insulating film formed over a substrate, a second base insulating film formed over the first base insulating film, and a thin film transistor including a semiconductor layer, a gate insulating film, and a gate electrode, which is formed over the second base insulating film. In addition, the display device of the invention comprises a first insulating film formed covering the thin film transistor, a second insulating film formed covering the first insulating film, a wiring formed over the second insulating film and electrically connected to the semiconductor layer through a contact hole, and a light-emitting element electrically connected to the wiring. An electrode of the light-emitting element on the substrate side transmits light. The second base insulating film, the gate insulating film, and the first insulating film are optically one layer, the refraction factor of the second base insulating film, the gate insulating film, and the first insulating film which are optically one layer is larger or smaller than the refraction factor of the first base insulating film and the second insulating film, and the optical thickness of the second base insulating film, the gate insulating film, and the first insulating film which are optically one layer is substantially equal to the integral multiple of λ/2 on the assumption that the center wavelength of the light emitted from the light-emitting element is λ.

A display device of the invention for solving the aforementioned problem comprises a first base insulating film formed over a substrate, a second base insulating film formed over the first base insulating film, and a thin film transistor including a semiconductor layer, a gate insulating film, and a gate electrode, which is formed over the second base insulating film. In addition, the display device of the invention comprises a first insulating film formed covering the thin film transistor, a second insulating film formed covering the first insulating film, a wiring formed over the second insulating film and electrically connected to the semiconductor layer through a contact hole, and a light-emitting element electrically connected to the wiring. An electrode of the light-emitting element on the substrate side transmits light, and each of the first base insulating film and the second insulating film is formed of a material containing silicon nitride as its main component while each of the second base insulating film, the gate insulating film and the first insulating film is formed of a material containing silicon oxide as its main component. The physical thickness of the first base insulating film is in the range of 120 to 162 nm, the physical thickness of the second insulating film is in the range of 120 to 162 nm, and the total physical thickness of the second base insulating film, the gate insulating film, and the first insulating film is in the range of 132 to 198 nm.

The display device of the invention is a display device having the improved viewing angle characteristics with a simple structure. Since the display device of the invention has the improved viewing angle characteristics, favorable image display can be provided. In addition, the display device of the invention can be manufactured without the need for additional steps or materials, thus a display device with the improved viewing angle characteristics can be provided easily.

BRIEF DESCRIPTION OF THE DRAWINGS

FIGS. 7A to 7D are sectional views illustrating the manufacturing process of a display device of the invention.

FIGS. 9A to 9E are views of electronic appliances of the invention.

FIGS. 12A to 12C are graphs showing the simulation result of reflectivity using monochrome light.

FIGS. 14A and 14B show the measured data on the emission spectrum, which shows the viewing angle characteristics.

DESCRIPTION OF THE INVENTION

Figure 1:
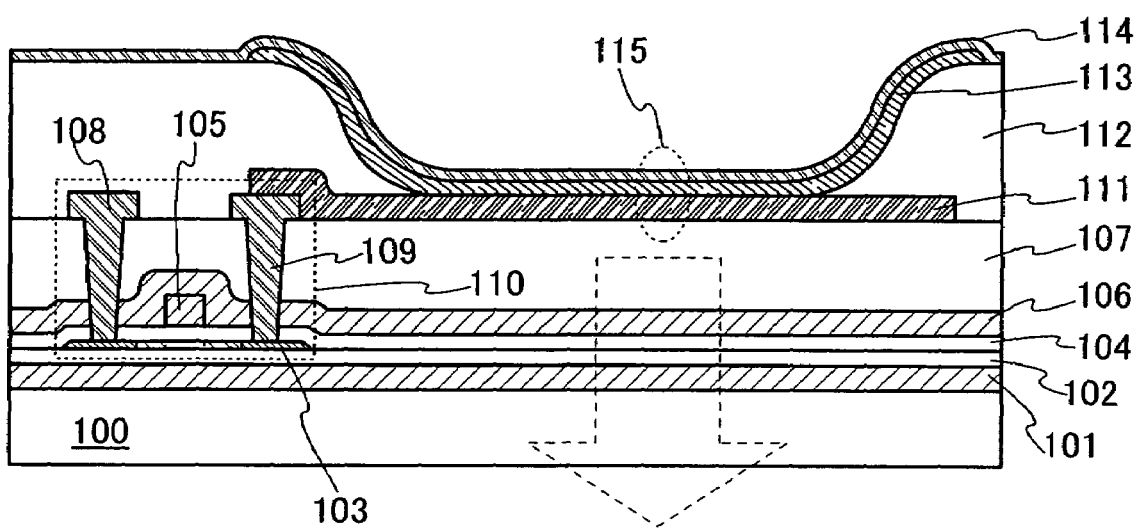
FIG. 1 is a sectional view of a display device of the invention.

Although the present invention will be fully described by way of Embodiment Modes and Embodiments with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

The inventors found out that in an active matrix display device where light is emitted in the direction of a substrate over which thin film transistors are formed, when focusing on the multiple interference caused by the light emitted from a light-emitting element, which is reflected on the film used for forming the thin film transistors, effect on the multiple interference can be drastically reduced by forming the reflecting film to have a specific thickness.

Note that in the invention, even when two or more films in contact with each other are manufactured through different steps, the films are optically regarded as one layer if they are formed of the same material or materials having the same or substantially the same refraction factor. In addition, physical thickness means an actual thickness of a film in question, and optical thickness means a thickness of the film, which is obtained by, on the assumption that light having a specific wavelength travels through the film, multiplying the physical thickness of the film by the refraction factor of the film at the wavelength of the light. In addition, the center wavelength is a wavelength having the strongest luminous intensity among the light emitted from a light-emitting element in question. Alternatively, the center wavelength may be a wavelength that the practitioner desires to obtain from the light-emitting element.

When the reflection becomes a problem at the time light travels through a plurality of stacked layers is the case where the light travels through the interface between layers having different refraction factors. Such a stacked-layer structure is often seen in the manufacture of a thin film transistor. For example, a stacked-layer structure of a silicon oxide film and a silicon nitride film is the typical example. When there is a difference in refraction factor between the stacked layers as large as the difference in refraction factor between the silicon oxide film and the silicon nitride film, multiple interference due to the light reflection becomes a problem.

In addition, the material used for a semiconductor device is limited because of the insulation property, film quality, blocking property, affinity with a semiconductor layer and the like. Therefore, inevitably, a repeatedly-stacked-layer structure of about two kinds of materials is often adopted. In addition, the material used for other components of the semiconductor device often has substantially the same refraction factor as one of the aforementioned materials.

In the invention, in the case where light emitted from a light-emitting element travels through one layer having a large or small refraction factor: n before the light is emitted outside, specifically the case where the light travels through a stacked-layer structure which satisfies the relationship of refraction factors: n1<n2>n3, or n1>n2<n3 in the order of the light traveling direction, the optical thickness L of the layer (layer having the refraction factor of n2) is set to $\lambda m/2$ (m is an integer not less than 1). When the optical thickness is converted into the physical thickness d, $\lambda m/2n$ is satisfied on the assumption that the refraction factor of a film forming the layer is n, and the center wavelength of the light emitted from the light-emitting element is $\lambda$.

By adopting such a structure, reflection that occurs when light enters the layer (layer having the refraction factor of n2), and reflection that occurs when light is emitted from the layer can be cancelled out by each other, thereby reflection caused by the presence of the layer can be decreased. The decrease of reflection can suppress the generation of the stationary wave, thereby a display device with improved viewing angle characteristics can be provided. Note that in order to obtain a display device having favorable viewing angle characteristics, the reflectivity of the layer may be 1% or less, and the optical thickness L of the layer having such reflectivity is about ±6% of $\lambda/2$. Therefore, the term "substantially" in the invention and specification means that a margin of ±6% is provided.

In addition, in the invention, in the case where light emitted from a light-emitting element travels through two layers each having a large or small refraction factor: n before the light is emitted outside, specifically the case where the light travels through one stacked-layer structure which satisfies the relationship of refraction factors: $n1<n2>n3<n4>n5$, or $n1>n2<n3>n4<n5$ in the order of the light traveling direction, the optical thickness L of the two layers (layers having the refraction factors of n2 and n4 respectively) is each set to $\lambda m/2$ (m is an integer not less than 1). When the optical thickness is converted into the physical thickness d, $\lambda m/2n$ is satisfied on the assumption that each refraction factor of the layers is n, and the center wavelength of the light emitted from the light-emitting element is $\lambda$.

Note that the two layers (layers having the refraction factors of n2 and n4 respectively) are preferably formed of the same material, or materials having the same or substantially the same refraction factor. By adopting such a structure, reflection that occurs when light enters the layers, and reflection that occurs when light is emitted from the layers can be cancelled out by each other, thereby the reflectivity of the layers can be decreased. The decrease of reflectivity can suppress the generation of the stationary wave, thereby a display device with improved viewing angle characteristics can be provided. Note that in order to obtain a display device having favorable viewing angle characteristics, each reflectivity of the layers may be 1% or less, and each optical thickness L of the layers having such reflectivity is about ±6% of $\lambda/2$.

In addition, in the invention, in the case where light emitted from a light-emitting element travels through two layers each having a large or small refraction factor: n before the light is emitted outside, specifically the case where the light travels through one stacked-layer structure which satisfies the relationship of refraction factors: $n1<n2>n3<n4>n5$, or $n1>n2<n3>n4<n5$ in the order of the light traveling direction, $L2=-L1+(2m-1)\lambda/4$ is satisfied on the assumption that each optical thickness of the two layers (layers having the refraction factors of n2 and n4 respectively) is L1, the optical thickness of a layer (layer having the refraction factor of n3) interposed between the two layers is L2, and the center wavelength of the light emitted from the light-emitting element is $\lambda$.

Note that the two layers (layers having the refraction factors of n2 and n4) are preferably formed of the same material, or materials having the same or substantially the same refraction factor, and the layer (layer having the refraction factor of n3) interposed between the two layers is required to be optically one layer. By adopting such a structure, the reflection that occurs on the interface between the layers having the refraction factors of n1 and n2 respectively is cancelled out by the reflection that occurs on the interface between the layers having the refraction factors of n3 and n4 respectively. Similarly, the reflection that occurs on the interface between the layers having the refraction factors of n2 and n3 respectively is cancelled out by the reflection that occurs on the interface between the layers having the refraction factors of n4 and n5 respectively. Thus, the reflectivity of the stacked films can be decreased. The decrease of the reflectivity can suppress the generation of the stationary wave, thereby a display device with improved viewing angle characteristics can be provided. Note that in order to obtain a display device having favorable viewing angle characteristics, each reflectivity of the layers may be 1% or less, and each physical thickness d of the layers having such reflectivity is about ±6% of L1 and L2 respectively.

In addition, in the invention, when the light emitted from a light-emitting element travels through one stacked-layer structure of two layers each having a refraction factor of about 1.8 and one layer between them having a refraction factor of about 1.5 before the light is emitted outside, the physical thickness of each layer having the refraction factor of about 1.8 is set to 120 to 162 nm while the physical thickness of the layer having the refraction factor of about 1.5 is set to 132 to 198 nm. By adopting such a structure, reflectivity of the layer can be decreased and generation of the stationary wave can be suppressed, thereby a display device with improved viewing angle characteristics can be provided. Note that in order to obtain a display device having favorable viewing angle characteristics, each reflectivity of the layers may be 1% or less, and such reflectivity can be achieved by the aforementioned physical thickness.

In addition, the present invention may be used in a display device comprising any one of a bottom emission type light emitting device and a dual emission type light emitting device.

Embodiment Mode 1

In this embodiment, description is made with reference to FIG. 1 on an example of a display device of the invention.

In the display device in this embodiment mode, a first base insulating film 101 and a second base insulating film 102 are formed in this order over a light-transmissive substrate 100. On the second base insulating film 102, a semiconductor layer 103 is formed, and a gate insulating film 104 is formed covering the semiconductor layer 103 and the second base insulating film 102. On the gate insulating film 104, a gate electrode 105 is formed in a partially overlapped manner with the semiconductor layer 103. The gate electrode 105 and the gate insulating film 104 are covered with a first insulating film 106, and the first insulating film 106 is covered with a second insulating film 107. On the second insulating film 107, electrodes 108 and 109 are provided to be electrically connected to the semiconductor layer 103 through contact holes which are formed to penetrate the second insulating film 107, the first insulating film 106 and the gate insulating film 104. The semiconductor layer 103, the gate insulating film 104, the gate electrode 105, and the electrodes 108 and 109 constitute a thin film transistor 110 in the pixel portion.

A first electrode 111 of a light-emitting element is formed in a partially overlapped manner with one electrode 109 of the thin film transistor 110. Over the first electrode 111, a third insulating film (also called a partition wall) 112 is formed with an aperture which exposes the first electrode 111, covering the second insulating film 107 and at least an end portion of the first electrode 111. Then, a light-emitting stack 113 is formed covering at least the aperture, and a second electrode 114 of the light-emitting element is formed covering the partition wall 112 and the light-emitting stack 113, thereby a light-emitting element 115 having the first electrode 111, the light-emitting stack 113 and the second electrode 114 is completed.

The substrate 100 may be formed by use of light-transmissive glass, quartz, plastic (e.g., polyimide, acrylic, polyethylene terephthalate, polycarbonate, polyacrylate or polyethersulfone) or the like. Such a substrate may be used after being polished by CMP or the like as required. In this embodiment mode, a glass substrate is used.

The first base insulating film 101 and the second base insulating film 102 are provided in order to prevent that elements such as an alkaline metal and an alkaline earth metal, which would adversely affect the characteristics of the semiconductor film, are diffused into the semiconductor layer. Typically, silicon oxide, silicon nitride, silicon oxide containing nitrogen, silicon nitride containing oxygen or the like may be employed. It has been known that a film containing silicon nitride as its main component is superior in blocking property of impurity elements (ions). Meanwhile, a film containing silicon oxide as its main component is advantageous in that it has a wider band gap, superior insulation property and lower trap level than the film containing silicon nitride as its main component. In this embodiment mode, the first base insulating film 101 is formed of a film containing silicon nitride as its main component while the second base insulating film 102 is formed of a film containing silicon oxide as its main component. Thus, favorable barrier property against impurities and excellent performance of the thin film transistor can be obtained at the same time.

In this embodiment mode, the physical thickness d of the first base insulating film 101 is set to $\lambda m/2n$ (m is an integer not less than 0) on the assumption that the center wavelength of the light emitted from the light-emitting element 115 is $\lambda$, and the refraction factor of the first base insulating film 101 at the center wavelength is n.

The display device of the invention is an active matrix display device having a pixel portion where a plurality of thin film transistors are formed over the second base insulating film, and the thin film transistor 110 in FIG. 1 shows one of them. Note that thin film transistors may also be formed in the portion other than the pixel portion of the display device so as to construct a driver circuit, a signal processing circuit, an audio circuit, a CPU or the like.

The thin film transistor 110 may be formed by a known method. The first insulating film 106 may be formed by use of a film containing silicon nitride as its main component though the material is not limited. The first insulating film 106 can be used as a passivation film for preventing the intrusion of impurities into the semiconductor layer 103, or a hydrogenation film for terminating a dangling bond in the semiconductor layer 103 using a large quantity of hydrogen contained in the film.

In this embodiment mode, the physical thickness d of the first insulating film 106 is set to $\lambda m/2n$ (m is an integer not less than 0) on the assumption that the center wavelength of the light emitted from the light-emitting element 115 is $\lambda$, and the refraction factor of the first insulating film 106 at the center wavelength is n.

In this embodiment mode, the gate insulating film 104 and the second base insulating film 102 are formed of the same material, or materials having the same or substantially the same refraction factor. Since the second base insulating film 102 is formed of a film containing silicon oxide as its main component, the gate insulating film 104 is also formed of a film containing silicon oxide as its main component so that these layers can be optically regarded as one layer.

In order to improve the aperture ratio of the light-emitting element 115, the second insulating film 107 is formed of a film having self-planarity, which is capable of alleviating irregularities of the lower layer. Such an insulating film may be formed of an acrylic, polyimide, a material so-called siloxane or the like. The siloxane is composed of a skeleton formed by the bond of silicon (Si) and oxygen (O), which contains as a substituent an organic group containing at least hydrogen (e.g., alkyl group or aryl group). Alternatively, a fluoro group may be used as the substituent, or both the fluoro group and the organic group containing at least hydrogen may be used as the substituent. In this embodiment mode, a film formed of siloxane is used as the second insulating film 107.

The light-emitting element 115 is constituted by the first electrode 111, the second electrode 114 and the light-emitting stack 113 interposed between them. One of the first electrode 111 and the second electrode 114 functions as an anode while the other functions as a cathode. Each light-emitting element is isolated from other light-emitting elements by the partition wall (also called a bank) 112. The partition wall 112 is formed covering at least an end portion of the first electrode 111, and an end portion of the partition wall 112 per se in the closer position to the light-emitting element has a curvature, which desirably has a tapered shape with a continuously variable curvature.

The partition wall 112 may be formed by use of either an organic material or an inorganic material, such as photosensitive or non-photosensitive acrylic, polyimide, siloxane, a film containing silicon oxide as its main component, and a film containing silicon nitride as its main component.

The first electrode 111 is desirably formed of a light-transmissive conductive material such as indium tin oxide (ITO). Note that in addition to ITO, ITO containing silicon oxide, indium zinc oxide (IZO) which is the mixture of indium oxide with zinc oxide of 2 to 20%, zinc oxide itself, zinc oxide containing gallium (GZO) or the like may be used.

The light-emitting stack 113 contains light-emitting substances, and is constituted by a single layer or a plurality of layers. Note that the light-emitting stack 113 may be formed of either an organic material or an inorganic material. Alternatively, it may be formed of both the inorganic material and the organic material.

In the display device of this embodiment mode having such a structure, light emitted from the light-emitting element 115 travels through the second insulating film 107, the first insulating film 106, the gate insulating film 104, the second base insulating film 102, the first base insulating film 101 and the substrate 100 before the light is emitted outside. Among them, the first insulating film 106 and the first base insulating film 101 have a large difference in refraction factor from the other films interposing the first insulating film 106 and the first base insulating film 101. Hereupon, in this embodiment, each physical thickness d of the first insulating film 106 and the first base insulating film 101 is set to $\lambda m/2n$ (m is an integer not less than 0), namely each optical thickness L of the first insulating film 106 and the first base insulating film 101 is set to $\lambda m/2$ (m is an integer not less than 0). Accordingly, the light reflected on the incident interface of the films can be attenuated by the light reflected on the emission interface of the films, thus the reflected light generated by such films can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be provided.

FIGS. 12A to 12C and 13 illustrate the simulation result of this embodiment mode, in which the first base insulating film 101 formed of a silicon nitride film containing oxygen, the second base insulating film 102 and the gate insulating film 104 each formed of a silicon oxide film containing nitrogen, the first insulating film 106 formed of a silicon nitride film containing oxygen, the second insulating film 107 formed of siloxane, and the light-emitting element 115 are formed over the substrate 100 in this order. The simulation is carried out by use of the Fresnel coefficient in order to inspect changes in reflectivity of the interface between the second insulating film 107 and the first insulating film 106 (this corresponds to the combined reflectivity of the light reflected on the interface between the first insulating film 106 and the gate insulating film 104, light reflected on the interface between the second base insulating film 102 and the first base insulating film 101, and light reflected on the interface between the first base insulating film 101 and the substrate 100) when the total thickness of the gate insulating film 104 and the second base insulating film 102, the thickness of the first insulating film 106 and the thickness of the first base insulating film 101 are changed. Note that in this embodiment mode, the gate insulating film 104 and the second base insulating film 102 are formed of the same material, and it can thus be regarded as one layer optically. Therefore, the total thickness of the gate insulating film 104 and the second base insulating film 102 is used for simulation.

Figure 13:
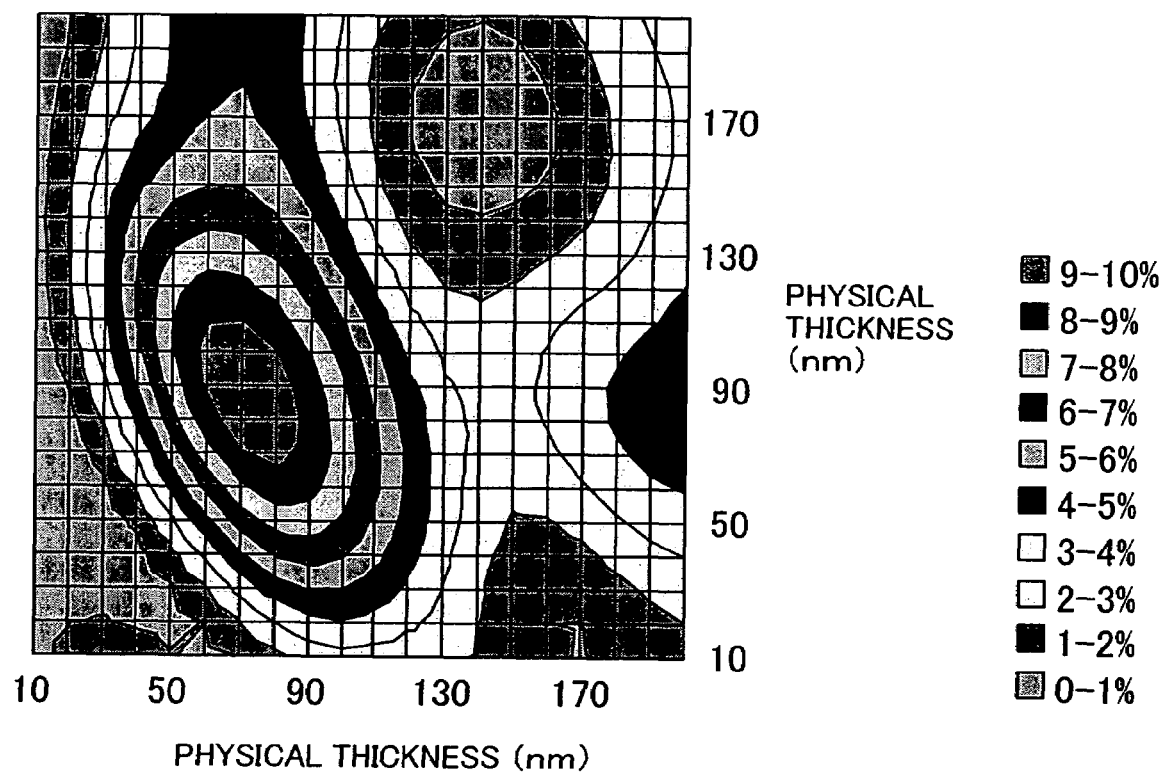
FIG. 13 is a graph showing the simulation result of reflectivity in full color display.

The graphs show the distribution of reflectivity of the first insulating film 106, in which the abscissa indicates the physical thickness of the film formed of silicon nitride containing oxygen (each thickness of the first base insulating film 101 and the first insulating film 106), and the ordinate indicates the physical thickness of the film formed of silicon oxide containing nitrogen (the total thickness of the second base insulating film 102 and the gate insulating film 104), which is interposed between the aforementioned two films. FIGS. 12A to 12C show changes in reflectivity in monochrome display while FIG. 13 shows the average reflectivity of the light having a wavelength of 400 to 700 nm.

FIG. 12A shows the simulation result carried out with the light having a center wavelength $\lambda=450$ nm which corresponds to the blue emission. It can be seen that the reflectivity is low in the vicinity of the physical thickness d of the first insulating film 106 and the first base insulating film 101 each being 125 nm which corresponds to the optical thickness $L=\lambda/2$. It is considered that the reflection on the interface between the first insulating film 106 and the second insulating film 107 being 1% or less has few adverse effects on the viewing angle characteristics. In the graph, the physical thickness d in the range of 115 to 133 nm with the center of 125 nm corresponds to the area having such reflectivity. Such a thickness range can provide the reflectivity of 1% or less regardless of the total thickness of the gate insulating film 104 and the second base insulating film 102, thereby a display device having favorable viewing angle characteristics can be provided.

IG. 12B shows the simulation result carried out with the light having a center wavelength $\lambda=540$ nm which corresponds to the green emission. It can be seen that the reflectivity is low in the vicinity of the physical thickness d of the first insulating film 106 and the first base insulating film 101 each being 152 nm which corresponds to the optical thickness $L=\lambda/2$. It is considered that the reflection on the interface between the first insulating film 106 and the second insulating film 107 being 1% or less has few adverse effects on the viewing angle characteristics. In the graph, the physical thickness d in the range of 138 to 162 nm corresponds to the area having such reflectivity. Such a thickness range can provide the reflectivity of 1% or less regardless of the total thickness of the gate insulating film 104 and the second base insulating film 102, thereby a display device having favorable viewing angle characteristics can be provided.

FIG. 12C shows the simulation result carried out with the light having a center wavelength $\lambda=620$ nm which corresponds to the red emission. It can be seen that the reflectivity is low in the vicinity of the physical thickness d of the first insulating film 106 and the first base insulating film 101 each being 175 nm which corresponds to the optical thickness $L=\lambda/2$. It is considered that the reflection on the interface between the first insulating film 106 and the second insulating film 107 being 1% or less has few adverse effects on the viewing angle characteristics. In the graph, the physical thickness d in the range of 160 to 186 nm corresponds to the area having such reflectivity. Such a thickness range can provide the reflectivity of 1% or less regardless of the total thickness of the gate insulating film 104 and the second base insulating film 102, thereby a display device having favorable viewing angle characteristics can be provided.

In this manner, when the center wavelength is apparent, that is the case where a manufactured display device is of a type for monochrome display or a multicolor display using a color filter, and the light emitted from a light-emitting element has a single maximal wavelength, or the intensity of the maximal wavelengths other than the center wavelength is sufficiently small, the reflection on the interface between the first insulating film 106 and the second insulating film 107 can be suppressed low by setting each physical thickness d of the first insulating film 106 and the first base insulating film 101 to the thickness substantially corresponding to the optical thickness $L=\lambda/2$. Note that in this case, the total thickness of the gate insulating film 104 and the second base insulating film 102 is not limited.

The simulation data also shows that the optical thickness of the first insulating film 106 and the first base insulating film 101 each being in the range of ±6% of $\lambda/2$ can provide a small reflectivity within the allowable range, thereby a display device having favorable viewing angle characteristics can be provided. Accordingly, in this specification, the term "substantially" for both of the physical thickness d and the optical thickness L means that a margin of ±6% is provided.

In addition, in FIGS. 12A to 12C, the reflectivity can also be suppressed low when the L2 (total optical thickness of the gate insulating film 104 and the second base insulating film 102) and L1 (each optical thickness of the first insulating film 106 and the first base insulating film 101) satisfy $L2=-L1+(2m-1)\lambda/4$ (m is an integer not less than 1), thus that the viewing angle characteristics are expected to be improved. In such a case, both of the thickness L2 and L1 are required to be controlled. It is considered that reflection can be reduced because the reflection that occurs on the interface between the second insulating film 107 and the first insulating film 106 is cancelled out by the reflection that occurs on the interface between the second base insulating film 102 and the first base insulating film 101, and the reflection that occurs on the interface between the first insulating film 106 and the gate insulating film 104 is cancelled out by the reflection that occurs on the interface between the first base insulating film 101 and the substrate 100.

Note that since the derived optical thickness L2 and L1 with a margin in the range of ±6% provide a small reflectivity within the allowable range of the viewing angle characteristics. Therefore, by setting the thickness so as to satisfy the condition, a display device capable of performing favorable image display can be provided with improved viewing angle characteristics.

FIG. 13 shows the average reflectivity of the film in the thickness range of 400 to 700 nm. The thickness range satisfying the reflectivity of 1% or less is: each physical thickness d of the first insulating film 106 and the first base insulating film 101 in the range of 120 to 162 nm, and the total physical thickness d of the gate insulating film 104 and the second base insulating film 102 in the range of 132 to 198 nm. By setting the physical thickness of the films within such ranges, favorable viewing angle characteristics can be provided even in a display device having a plurality of types of light-emitting elements with different center wavelengths such as a full-color display device of an RGB separation type and a display device using white light-emitting elements, or even in a display device using one type of light-emitting elements, which has the emission spectrum including a plurality of strong maximal wavelengths.

In addition, even when the center wavelength is apparent, a display device having favorable viewing angle characteristics can be provided with any wavelengths as long as each physical thickness d of the first insulating film 106 and the first base insulating film 101 is set in the range of 120 to 162 nm, and the total physical thickness d of the gate insulating film 104 and the second base insulating film 102 is set in the range of 132 to 198 nm.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be arbitrarily controlled by a practitioner. That is, it is at least required that each layer, through which, the light emitted from the light-emitting element 115 travels to the outside of the display device, be controlled to have the aforementioned thickness.

Embodiment Mode 2

Figure 2:
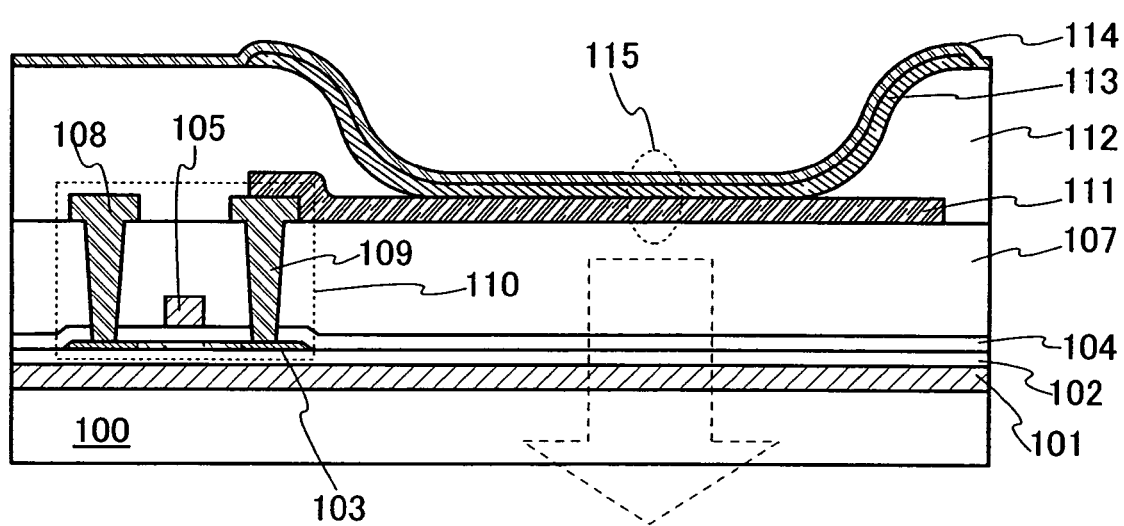
FIG. 2 is a sectional view of a display device of the invention.

In this embodiment mode, description is made with reference to FIG. 2 on another structure of the invention. The display device in this embodiment mode has substantially the same structure as the display device in Embodiment Mode 1; however, the first insulating film 106 in Embodiment Mode 1 is not provided. In this case, only the first base insulating film 101 has a different refraction factor from other films, among the layers through which the light emitted from the light-emitting element 115 travels to the outside.

Therefore, by setting the optical thickness L of the first base insulating film 101 to be substantially equal to the integral multiple of $\lambda/2$ on the assumption that the center wavelength of the light emitted from the light-emitting element 115 is $\lambda$, the light reflected on the incident interface of the film can be attenuated by the light reflected on the emission interface of the film, thus the reflected light generated by such film can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Note that in this embodiment mode, the second base insulating film 102, the gate insulating film 104 and the second insulating film 107 are indispensably formed of materials having substantially the same refraction factor.

Structures other than the aforementioned one are similar to those in Embodiment Mode 1; therefore, Embodiment Mode 1 is to be referred to.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be controlled by a practitioner. That is, it is at least required that each layer, through which the light emitted from the light-emitting element 115 travels to the outside of the display device, be controlled to have the aforementioned thickness.

Embodiment Mode 3

Figure 3:
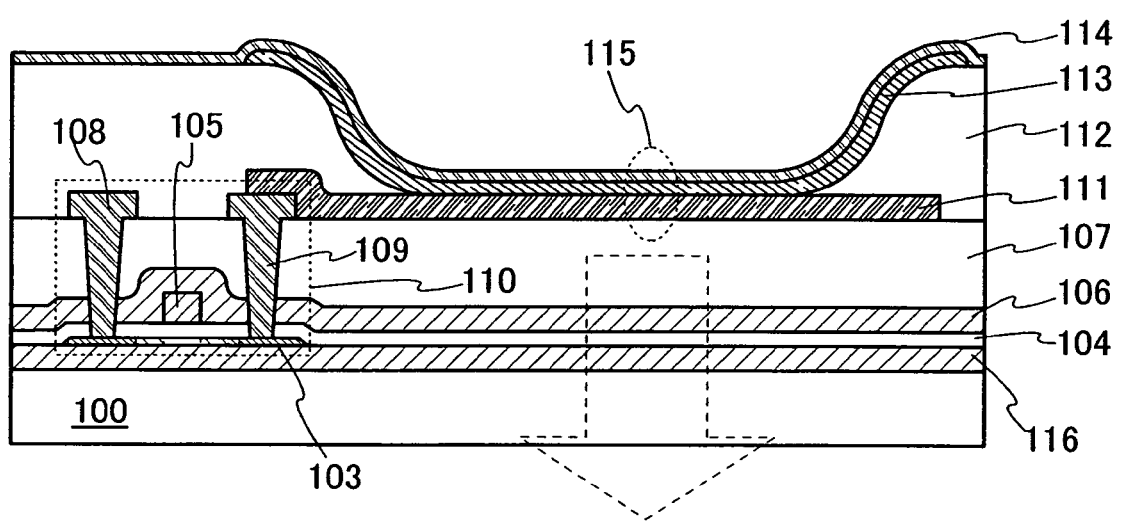
FIG. 3 is a sectional view of a display device of the invention.

In this embodiment mode, description is made with reference to FIG. 3 on still another structure of the invention. The display device in this embodiment mode has substantially the same structure as the display device in Embodiment Mode 1; however, the second base insulating film 102 in Embodiment Mode 1 is not provided and only the base insulating film 116 is provided as a base insulating film. This embodiment mode illustrates an example in which the base insulating film 116 is formed of silicon nitride containing oxygen. In this case, two layers which are the first insulating film 106 and the base insulating film 116 have different refraction factors from other films, among the layers through which the light emitted from the light-emitting element 115 travels to the outside.

Here, by setting each optical thickness L of the first insulating film 106 and the base insulating film 116 to be substantially equal to the integral multiple of $\lambda/2$ on the assumption that the center wavelength of the light emitted from the light-emitting element 115 is $\lambda$, the light reflected on the incident interface of the films can be attenuated by the light reflected on the emission interface of the films, thus the reflected light generated by such films can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Alternatively, on the assumption that each optical thickness of the first insulating film 106 and the base insulating film 116 is L1, and the optical thickness of the gate insulating film 104 provided between the first insulating film 106 and the base insulating film 116 is L2, the film thickness is set to satisfy $L2=-L1+(2m-1)\lambda/4$. Accordingly, the reflected light can be drastically decreased, which in turn can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Alternatively, each physical thickness d of the first insulating film 106 and the base insulating film 116 is set in the range of 120 to 162 nm, and the physical thickness d of the gate insulating film 104 is set in the range of 132 to 198 nm. Accordingly, the reflected light can be drastically decreased, which in turn can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Structures other than the aforementioned one are similar to those in Embodiment Mode 1; therefore, Embodiment Mode 1 is to be referred to.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be controlled by a practitioner. That is, it is only required that each layer, through which the light emitted from the light-emitting element 115 travels to the outside of the display device, be controlled to have the aforementioned thickness.

Embodiment Mode 4

Figure 4:
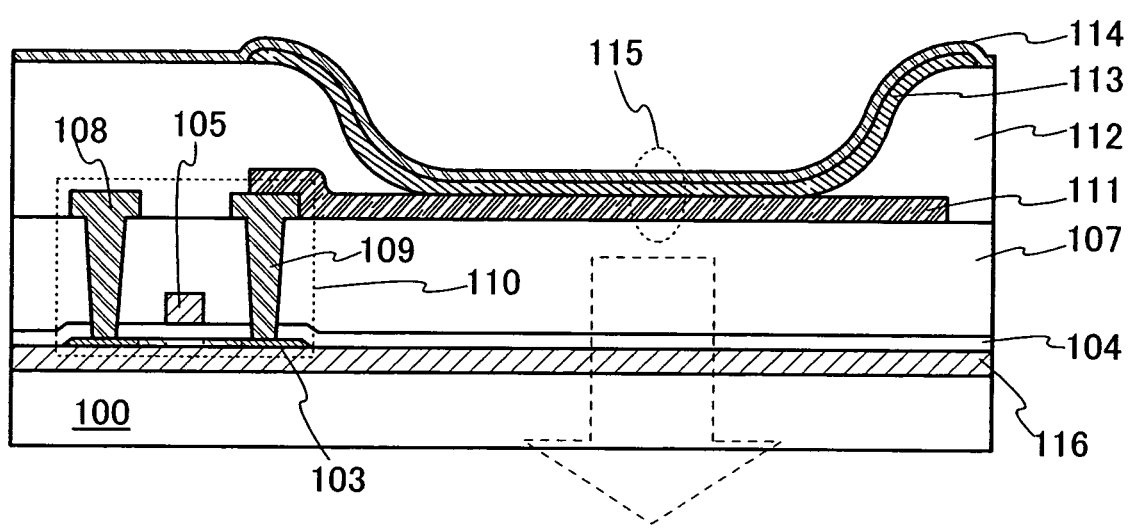
FIG. 4 is a sectional view of a display device of the invention.

In this embodiment mode, description is made with reference to FIG. 4 on still another structure of the invention. The display device in this embodiment mode has substantially the same structure as the display device in Embodiment Mode 1; however, the second base insulating film 102 and the first insulating film 106 in Embodiment Mode 1 are not provided, and only the base insulating film 116 is provided as a base insulating film. This embodiment mode illustrates an example in which the base insulating film 116 is formed of silicon nitride containing oxygen. In this case, only the base insulating film 116 has a different refraction factor from other films, among the layers through which the light emitted from the light-emitting element 115 travels to the outside.

Here, by setting the optical thickness L of the base insulating film 116 to be substantially equal to the integral multiple of λ/2 on the assumption that the center wavelength of the light emitted from the light-emitting element 115 is λ, the light reflected on the incident interface of the film can be attenuated by the light reflected on the emission interface of the film, thus the reflected light generated by such film can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Note that in this embodiment mode, it is essential that the gate insulating film 104 and the second insulating film 107 be formed of materials having substantially the same refraction factor.

Structures other than the aforementioned one are similar to those in Embodiment Mode 1; therefore, Embodiment Mode 1 is to be referred to.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be arbitrarily controlled by a practitioner. That is, it is only required that each layer, through which the light emitted from the light-emitting element 115 travels to the outside of the display device, be controlled to have the aforementioned thickness.

Embodiment Mode 5

Figure 5:
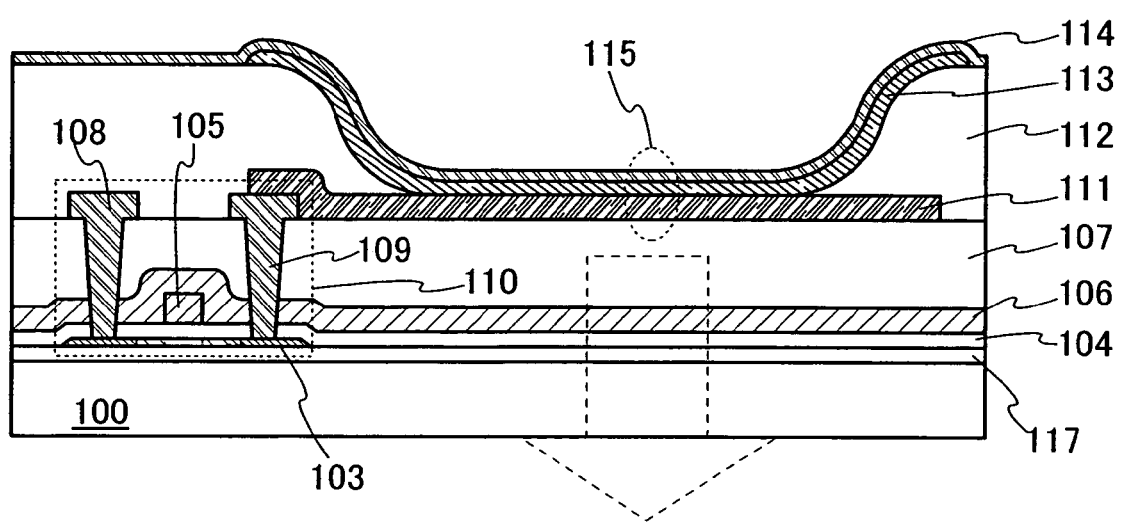
FIG. 5 is a sectional view of a display device of the invention.

In this embodiment mode, description is made with reference to FIG. 5 on still another structure of the invention. A display device in this embodiment mode has substantially the same structure as the display device in Embodiment Mode 1; however, the first base insulating film 101 in Embodiment Mode 1 is not provided, and only the base insulating film 117 is provided as a base insulating film. This embodiment mode illustrates an example in which the base insulating film 117 is formed of silicon oxide containing nitrogen. In this case, only the first insulating film 106 has a different refraction factor from other films, among the layers through which the light emitted from the light-emitting element 115 travels to the outside.

Here, by setting the optical thickness L of the first insulating film 106 to be substantially equal to the integral multiple of λ/2 on the assumption that the center wavelength of the light emitted from the light-emitting element 115 is λ, the light reflected on the incident interface of the film can be attenuated by the light reflected on the emission interface of the film, thus the reflected light generated by such film can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Structures other than the aforementioned one are similar to those in Embodiment Mode 1; therefore, Embodiment Mode 1 is to be referred to.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be arbitrarily controlled by a practitioner. That is, it is only required that each layer, through which the light emitted from the light-emitting element 115 travels to the outside of the display device, be controlled to have the aforementioned thickness.

Embodiment Mode 6

Figure 15:
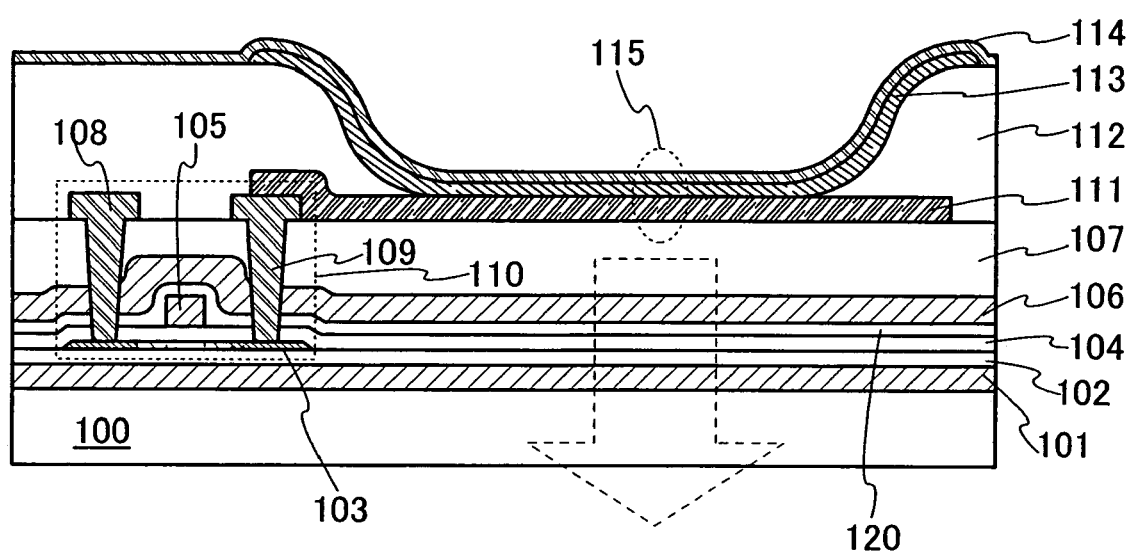
FIG. 15 is a sectional view of a display device of the invention.

In this embodiment mode, description is made with reference to FIG. 15 on still another structure of the invention. The display device in this embodiment has substantially the same structure as the display device in Embodiment Mode 1; however, a fourth insulating film 120 is provided between the gate insulating film 104 and the gate electrode 105, and the first insulating film 106, which are shown in Embodiment Mode 1. The fourth insulating film 120 is formed of the same material as the second base insulating film 102 and the gate insulating film 104, or materials having the same or substantially the same refraction factor so that the stacked layers of the second base insulating film 102, the gate insulating film 104 and the fourth insulating film 120 can be optically regarded as one layer. Further, the physical thickness d of the stacked layers of the second base insulating film 102, the gate insulating film 104 and the fourth insulating film 120, which are optically regarded as one layer, is set in the range of 132 to 198 nm, and each physical thickness d of the first insulating film 106 and the first base insulating film 101 is set in the range of 120 to 162 nm.

According to the simulation result of Embodiment Mode 1 shown in FIG. 13, the physical thickness d of the stacked layers of the second base insulating film 102 and the gate insulating film 104, which are optically regarded as one layer, is desirably in the range of 132 to 198 nm. However, it has been known that the thickness of the second base insulating film 102 and the gate insulating film 104 has a preferable value in terms of the operation of the thin film transistor 110, and the preferable value for the operation of the transistor from the view point of the transistor characteristics is not always identical to the value which enables the improvement of the viewing angle characteristics. Therefore, this embodiment mode illustrates a structure provided with the fourth insulating film 120 for improving the viewing angle characteristics while maintaining the second base insulating film 102 and the gate insulating film 104 to have a preferable thickness for the operation of the thin film transistor 110. Specifically, according to the structure of this embodiment mode, the second base insulating film 102 and the gate insulating film 104 are controlled to have the thickness preferable for the operation of a thin film transistor, and the shortage in thickness thereof is supplemented by the provision of the fourth insulating film 120. Accordingly, both of the characteristics of the thin film transistor and the viewing angle characteristics can be maintained favorably.

By controlling the stacked layers of the second base insulating film 102, the gate insulating film 104 and the fourth insulating film 120, which are optically regarded as one layer to have the physical thickness d in the range of 132 to 198 nm, and by controlling each of the first insulating film 106 and the first base insulating film 101 to have the physical thickness d in the range of 120 to 162 nm, the reflected light can be drastically reduced. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

The structure of this embodiment mode has one additional layer as the insulating film; however, the number of optical layers is not changed by the provision of the insulating film (fourth insulating film 120) which is formed of the same material as the second base insulating film 102 and the gate insulating film 104 or materials having the same or substantially the same refraction factor. Thus, the stacked layers of the second base insulating film 102, the gate insulating film 104 and the fourth insulating film 120 in this embodiment mode can be treated similarly to the stacked layers of the second base insulating film 102 and the gate insulating film 104 in Embodiment Mode 1. In addition, other stacked layers having a further additional layer can be treated similarly as long as they can be optically regarded as one layer.

Structures other than the aforementioned one are similar to those in Embodiment Mode 1; therefore, Embodiment Mode 1 is to be referred to.

Note that the thickness of each film is controlled so that the film thickness can be provided at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be arbitrarily controlled by a practitioner. That is, it is only required that each layer, through which the light emitted from the light-emitting element 115 travels to the outside of the display device, be controlled to have the aforementioned thickness.

Embodiment Mode 7

Figure 16A:
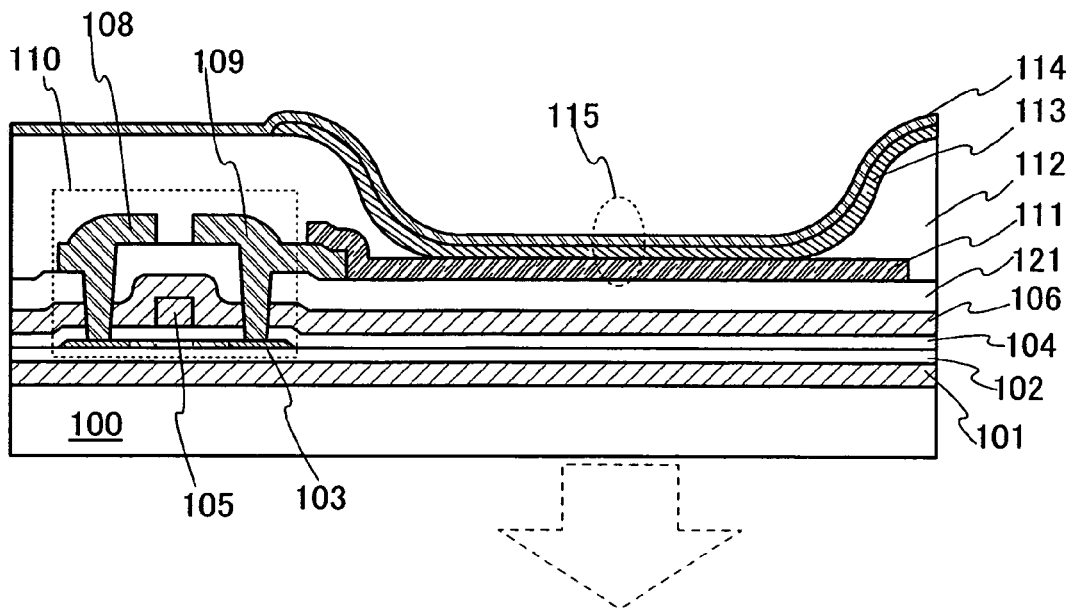
FIGS. 16A and 16B are sectional views of a display device of the invention.

In this embodiment mode, description is made with reference to FIG. 16A on still another structure of the invention. The display device in this embodiment mode has substantially the same structure as the display device in Embodiment Mode 1; however, the second insulating film 107, which is formed of a film with self-planarity in Embodiment Mode 1, is substituted with a fifth insulating film 121 which is formed of other insulating material with no self-planarity. The fifth insulating film 121 may be formed by use of silicon oxide, silicon oxide containing nitrogen or the like.

In the display device in this embodiment mode having such a structure, light emitted from the light-emitting element 115 travels through the fifth insulating film 121, the first insulating film 106, the gate insulating film 104, the second base insulating film 102, the first base insulating film 101 and the substrate 100 before the light is emitted to the outside of the display device. Among them, the first insulating film 106 and the first base insulating film 101 have a large difference in refraction factor from the other films interposing the first insulating film 106 and the first base insulating film 101. In this embodiment mode, by setting each physical thickness d of the first insulating film 106 and the first base insulating film 101 to $\lambda m/2n$ (m is an integer not less than 0), namely, by setting each optical thickness L of the first insulating film 106 and the first base insulating film 101 to $\lambda m/2$ (m is an integer not less than 0), the light reflected on the incident interface of the films can be attenuated by the light reflected on the emission interface of the films, thus the reflected light generated by such films can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Alternatively, on the assumption that each optical thickness of the first insulating film 106 and the first base insulating film 101 is L1, and the optical thickness of the gate insulating film 104 provided between the first insulating film 106 and the first base insulating film 101 is L2, the film thickness is set to satisfy $L2=-L1+(2m-1)\lambda/4$. Accordingly, the reflected light can be drastically decreased, which in turn can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Alternatively, each physical thickness d of the first insulating film 106 and the first base insulating film 101 is set in the range of 120 to 162 nm, and the physical thickness d of the stacked layers of the second base insulating film 102 and the gate insulating film 104, which are optically regarded as one layer, is set in the range of 132 to 198 nm. Accordingly, the reflected light can be drastically decreased, which in turn can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Structures other than the aforementioned one are similar to those in Embodiment Mode 1; therefore, Embodiment Mode 1 is to be referred to.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be arbitrarily controlled by a practitioner. That is, it is only required that each layer, through which the light emitted from the light-emitting element 115 travels to the outside of the display device, be controlled to have the aforementioned thickness.

Embodiment Mode 8

Figure 16B:
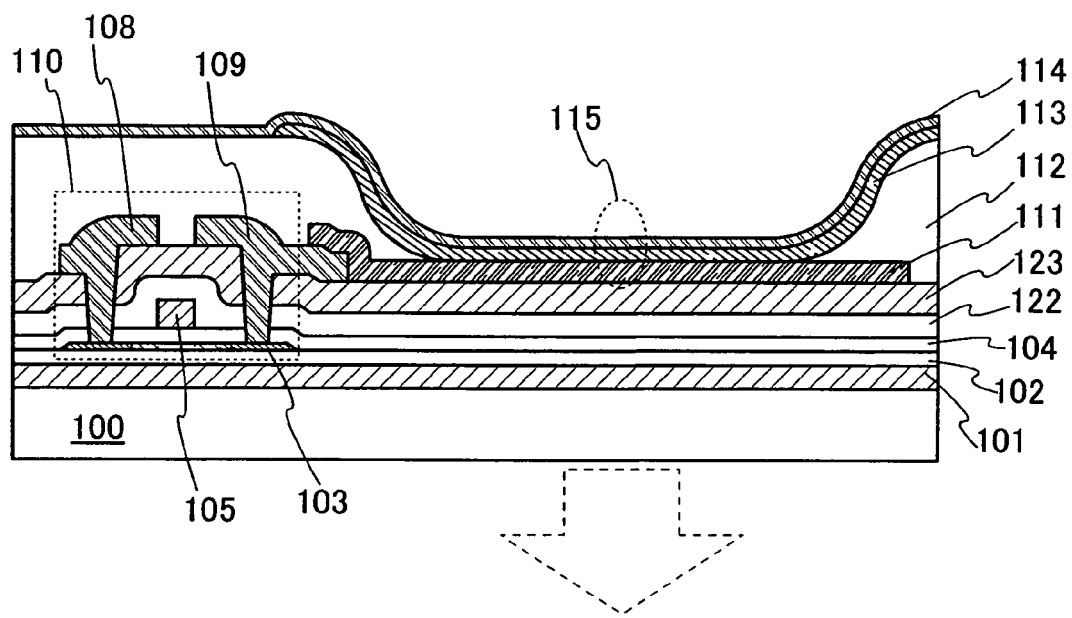

In this embodiment mode, description is made with reference to FIG. 16B on still another structure of the invention. The display device in this embodiment mode has substantially the same structure as Embodiment Mode 1; however, the second insulating film 107, which is formed of a film with self-planarity in Embodiment Mode 1, is substituted with a sixth insulating film 122 formed of other insulating materials with no self-planarity, and further the first insulating film 106 is not provided. In addition, a seventh insulating film 123 is provided in contact with the first electrode 111 of the light-emitting element. The sixth insulating film 122 may be formed of silicon oxide, silicon oxide containing nitrogen and the like, and the seventh insulating film 123 may be formed of silicon nitride, silicon nitride containing oxygen and the like.

In the display device having such a structure, light emitted from the light-emitting element 115 travels through the seventh insulating film 123, the sixth insulating film 122, the gate insulating film 104, the second base insulating film 102, the first base insulating film 101 and the substrate 100 before the light is emitted to the outside of the display device.

In this case, it can be considered that only the first base insulating film 101 has a different refraction factor among the layers through which the light emitted from the light-emitting element 115 travels to the outside.

Here, by setting the optical thickness L of the first base insulating film 101 to be substantially equal to the integral multiple of $\lambda/2$ on the assumption that the center wavelength of the light emitted from the light-emitting element 115 is $\lambda$, the light reflected on the incident interface of the film can be attenuated by the light reflected on the emission interface of the film, thus the reflected light generated by such film can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Structures other than the aforementioned one are similar to those in Embodiment Mode 1; therefore, Embodiment Mode 1 is to be referred to.

Note that the thickness of each film is controlled so that the film thickness can be obtained at the stage when the semiconductor device is completed. When actually manufacturing a semiconductor device, there might be a case where a film located below the semiconductor layer 103, the gate electrode 104, the electrodes 108 and 109, the first electrode 111 of the light-emitting element, and the like is reduced in thickness due to the etching for formation of such films. In such a case, it is required that each layer, through which the light emitted from the light-emitting element 115 travels to the outside of the display device, be set to have a predetermined thickness in consideration of the thickness reduced, which can be arbitrarily controlled by a practitioner. That is, it is only required that each layer, through which the light emitted from the light-emitting element 115 travels to the outside of the display device, be controlled to have the aforementioned thickness.

Embodiment Mode 9

In this embodiment mode, description is made with reference to FIGS. 6A to 6E and 7A to 7D on a manufacturing method of a light-emitting device of the invention having the structure shown in Embodiment Mode 1.

Figure 6A:
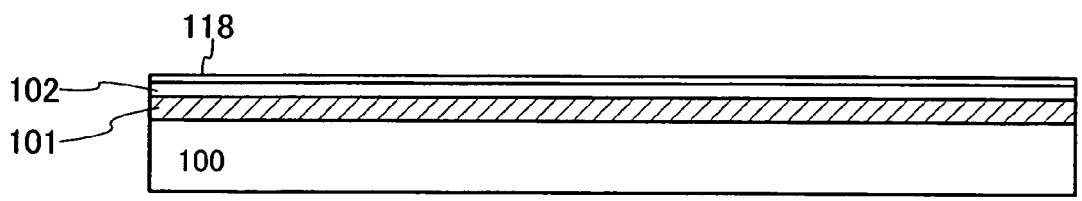
FIGS. 6A to 6E are sectional views illustrating the manufacturing process of a display device of the invention.

The first base insulating film 101 and the second base insulating film 102 are formed in this order over the substrate 100, over which a semiconductor film is further formed (FIG. 6A).

The substrate 100 may be formed by use of light-transmissive glass, quartz, plastic (e.g., polyimide, acrylic, polyethylene terephthalate, polycarbonate, polyacrylate or polyethersulfone) or the like. Such a substrate may be used after being polished by CMP or the like as required. In this embodiment mode, a glass substrate is used.

The first base insulating film 101 and the second base insulating film 102 are provided in order to prevent that elements such as an alkaline metal and an alkaline earth metal, which would adversely affect the characteristics of the semiconductor film, are diffused into the semiconductor layer.

Typically, silicon oxide, silicon nitride, silicon oxide containing nitrogen, silicon nitride containing oxygen or the like may be employed.

As set forth above, the first base insulating film 101 and the second base insulating film 102 are provided in order to prevent that impurity elements (ions) such as an alkaline metal and an alkaline earth metal, which would adversely affect the characteristics of the semiconductor film, are diffused into the semiconductor layer. It has been known that a film containing silicon nitride as its main component is superior in blocking property against such impurity elements (ions). Meanwhile, a film containing silicon oxide as its main component is advantageous in that it has a wider band gap, superior insulation property, lower trap level than the film containing silicon nitride as its main component.

Therefore, in this embodiment mode, the base insulating film is formed by stacking the first base insulating film 101 formed of silicon nitride containing oxygen, and the second base insulating film 102 formed of silicon oxide containing nitrogen in this order. Thus, favorable barrier properties against impurities (ions) and the high reliability of the thin film transistor can be obtained at the same time.

Note that the optical thickness L (L=refraction factor: n×physical thickness: d) of the first base insulating film 101 is set substantially equal to be the integral multiple of $\lambda/2$ on the assumption that the center wavelength of the light emitted from a light-emitting element to be formed later is $\lambda$. In addition, in the case of a display device having a plurality of types of light-emitting elements each having a different center wavelength such as a full-color display device of an RGB separation type and a display device using white light-emitting elements, or even in the case of a display device using one type of light-emitting elements, which has the emission spectrum including a plurality of strong maximal wavelengths, the physical thickness d of the first base insulating film 101 is preferably set in the range of 120 to 160 nm.

A semiconductor film 118 formed next is obtained by crystallizing an amorphous silicon film by laser irradiation in this embodiment mode. The amorphous silicon film is formed with a thickness of 25 to 100 nm (preferably 30 to 60 nm) over the second base insulating film 102. The amorphous silicon film can be deposited by a known method, for example, such as sputtering, low-pressure CVD and plasma CVD. Then, the film is dehydrogenated by thermal treatment at 500° C. for 1 hour.

Subsequently, the amorphous silicon film is crystallized with a laser irradiation apparatus to obtain a crystalline silicon film. The laser crystallization in this embodiment mode is carried out with an excimer laser. An oscillated laser beam is processed into a linear beam with an optical system to be irradiated onto the amorphous silicon film, thereby a crystalline silicon film is obtained to serve as the semiconductor film 118.

The amorphous silicon film can be crystallized by, in addition to the laser crystallization, only thermal treatment or thermal treatment with catalytic elements for promoting crystallization. As the elements for promoting crystallization, there are nickel, iron, palladium, tin, lead, cobalt, platinum, copper, gold and the like. With such elements, crystallization can be performed at lower temperature and in shorter time as compared to the crystallization only by thermal treatment, thus it has few damaging effects on the glass substrate or the like. In the case of the crystallization only by thermal treatment, the substrate 100 is required to be a quartz substrate or the like which is highly resistant to heat.

Subsequently, in order to control the threshold value as required, so-called channel doping is performed by doping the semiconductor film 118 with a slight amount of impurities. In order to obtain the required threshold value, N-type or P-type impurities (phosphorous or boron) are doped by ion doping or the like.

Figure 6B:
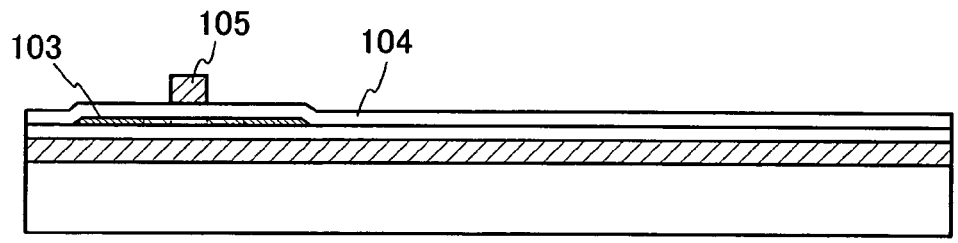

Then, as shown in FIG. 6B, the semiconductor film 118 is patterned into a desired shape to obtain the semiconductor layer 103. The patterning is performed by coating the semiconductor film 118 with a photoresist, exposing and baking the film into a predetermined mask shape so as to form a resist mask over the semiconductor layer, and etching the film with the mask.

Subsequently, the gate insulating film 104 is formed covering the semiconductor layer 103. The gate insulating film 104 is formed by use of an insulating film containing silicon with a thickness of 40 to 150 nm by plasma CVD or sputtering. In this embodiment mode, the gate insulating film 104 and the second base insulating film 102 are formed of the same material or materials having the same or substantially the same refraction factor; therefore, the gate insulating film 104 and the second base insulating film 102 can be optically regarded as a single layer. In this embodiment mode, the gate insulating film 104 is formed by use of silicon oxide containing nitrogen similarly to the second base insulating film 102.

Note that in this embodiment mode, each optical thickness L of the first base insulating film 101 and the first insulating film 106 is substantially equal to the integral multiple of $\lambda/2$; therefore, the thickness of the gate insulating film 104 and the second base insulating film 102 is not limited in the case where a manufactured display device is of a type for monochrome display or a multicolor display using a color filter, and the light emitted from a light-emitting element has a single maximal wavelength, or the intensity of the maximal wavelengths other than the center wavelength is sufficiently small, in which case the viewing angle characteristics are not adversely affected.

However, in the case of a display device having a plurality of types of light-emitting elements each having a different center wavelength such as a full-color display device of an RGB separation type and a display device using white light-emitting elements, or even in the case of a display device using one type of light-emitting elements, which has the emission spectrum including a plurality of strong maximal wavelengths, the total thickness of the second base insulating film 102 and the gate insulating film 104 is desirably within the range of 130 to 200 nm.

Subsequently, the gate electrode 105 is formed on the gate insulating film 104. The gate electrode 105 may be formed by use of an element selected from Ta, W, Ti, Mo, Al, Cu, Cr and Nd, or an alloy material or a compound material containing such element as its main component. Alternatively, the gate electrode 105 may be formed by use of a semiconductor film typified by a polycrystalline silicon film doped with impurity elements such as phosphorous. Further alternatively, an AgPdCu alloy may be used.

Although the gate electrode 105 is formed in a single layer in this embodiment mode, a stacked-layer structure of two or more layers may be employed such as the one having the bottom layer of tungsten and the top layer of molybdenum. For forming a gate electrode to have a stacked-layer structure, the aforementioned materials may be employed. The combination of the materials may be selected appropriately.

The gate electrode 105 is formed by etching with a photoresist mask.

Subsequently, the semiconductor layer 103 is doped with a high concentration of impurities using the gate electrode 105 as a mask.

In this embodiment mode, a top-gate thin film transistor using a crystalline silicon film which is crystallized by laser irradiation is used in the pixel portion; however, a bottom-gate thin film transistor using an amorphous semiconductor film can be used as well. The amorphous semiconductor may be formed by use of not only silicon but also silicon germanium. In the case of using silicon germanium, the concentration of germanium is preferably about 0.01 to 4.5 atomic %.

The amorphous semiconductor may include a microcrystalline (μc) semiconductor film (semi-amorphous semiconductor) in which crystal grains of 0.5 to 20 nm can be observed.

Semi-amorphous silicon (also referred to as SAS) as a semi-amorphous semiconductor can be obtained by decomposing a silicon source gas by glow discharge. As a typical silicon source gas, $SiH_4$ can be used as well as $Si_2H_6$, $SiH_2Cl_2$, $SiHCl_3$, $SiCl_4$, $SiF_4$ and the like. The use of the silicon source gas can facilitate the formation of the SAS when diluted with one or more rare gas elements selected from hydrogen, hydrogen and helium, argon, krypton and neon. The silicon source gas is preferably diluted at a dilution rate of 10 to 1000 times. The glow discharge decomposition for film deposition may be carried out at a pressure of 0.1 to 133 Pa. The power supplied for generating the glow discharge may be 1 to 120 MHz, and preferably RF power of 13 to 60 MHz. The substrate is preferably heated not higher than 300° C., and preferably in the range of 100 to 250° C.

The SAS formed in this manner has the Raman spectrum shifted to the lower frequency side than 520 $cm^{-1}$, and the diffraction peaks at (111) and (220) can be observed by the X-ray diffraction, which are supposedly caused by the Si-crystal lattice. The SAS contains hydrogen or halogen of at least 1 atomic % in order to terminate a dangling bond. As the impurity elements contained in the film, impurities of the atmospheric component such as oxygen, nitrogen and carbon are desirably set to have the concentration of $1\times10^{20}$ $cm^{-3}$ or less. In particular, the concentration of oxygen is set $5\times10^{19}/cm^{-3}$ or less, and more preferably $1\times10^{19}/cm^{-3}$ or less. When the SAS is used for a TFT, μ=1 to 10 $cm^2/Vsec$ is satisfied.

In addition, the SAS may be further crystallized by laser irradiation.

Figure 6C:
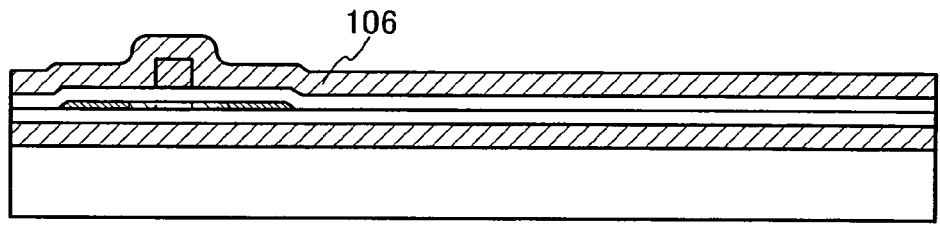

Subsequently, the first insulating film 106 is formed by use of silicon nitride containing oxygen covering the gate electrode 105 and the gate insulating film 104 (FIG. 6C). After the formation of the first insulating film 106, impurity elements doped in the semiconductor layer 103 are activated by applying heat at 480° C. for about 1 hour. Simultaneously, the semiconductor layer 103 is hydrogenated with the hydrogen contained in the first insulating film 106.

Here, the optical thickness L (L=refraction factor: n×physical thickness: d) of the first insulating film is set to be substantially equal to the integral multiple of λ/s on the assumption that the center wavelength of the light emitted from a light-emitting element to be formed later is λ. In addition, in the case of a display device having a plurality of types light-emitting elements each having a different center wavelength such as a full-color display device of an RGB separation type and a display device using white light-emitting elements, or even in the case of a display device using one type of light-emitting elements, which has the emission spectrum including a plurality of strong maximal wavelengths, the thickness of the first insulating film 106 may be set in the range of 120 to 160 nm.

Figure 6D:
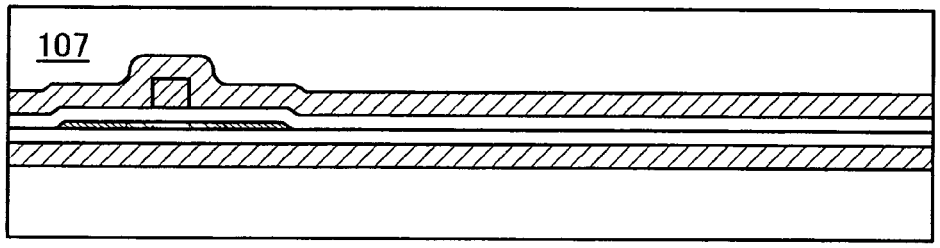

Subsequently, the second insulating film 107 covering the first insulating film 106 is formed. The second insulating film 107 is preferably formed by use of a film having self-planarity such as acrylic, polyimide and siloxane. In this embodiment mode, a siloxane film is formed as the second insulating film (FIG. 6D).

Figure 6E:
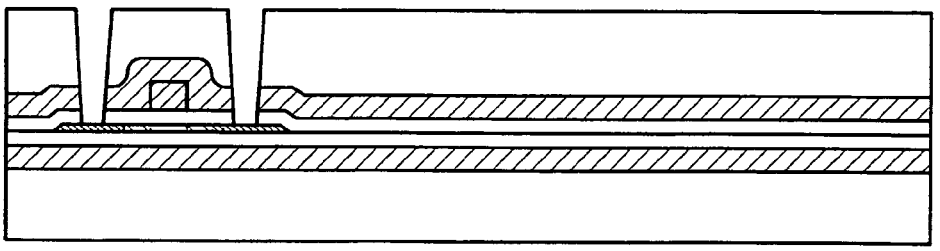

Then, contact holes are formed to reach the semiconductor film 103 (FIG. 6E). The contact holes can be formed by etching enough to expose the semiconductor layer 103 using a resist mask, and either wet etching or dry etching may be employed. Note that according to the etching condition, etching may be performed at a time or over a plurality of times. In the case of performing etching over a plurality of times, both of the wet etching and dry etching may be employed.

Then, a conductive layer covering the contact holes and the second insulating film 107 is formed, and the conductive layer is processed into a desired shape so as to form the electrodes 108 and 109, and other wirings. These electrodes and wirings may be formed in a single layer of aluminum, copper or the like. In this embodiment mode, a stacked-layer structure of molybdenum, aluminum and molybdenum in this order from the substrate side is employed. As an alternative stacked-layer wiring, a stacked-layer structure of titanium, aluminum and titanium in this order from the substrate side, or a stacked-layer structure of titanium, titanium nitride, aluminum and titanium in this order from the substrate side may be employed (FIG. 7A). At this stage, the thin film transistor 110 is formed.

Note that the manufacturing steps of the thin film transistor 110 are not specifically limited, and they may be changed appropriately so that a transistor with a desired structure can be manufactured.

Then, after forming a light-transmissive conductive layer covering the electrodes 108 and 109, the wirings, and the second insulating film 107, the light-transmissive conductive layer is processed to form the first electrode 111 of the light-emitting element which partially overlaps the electrode 109. Here, the first electrode 111 is electrically connected to the electrode 109. The first electrode 111 may be formed by use of indium tin oxide (ITO), ITO containing silicon oxide (ITSO), indium zinc oxide (IZO) which is the mixture of indium oxide with zinc oxide of 2 to 20%, zinc oxide itself, zinc oxide containing gallium (GZO) or the like. In this embodiment mode, ITSO is used as the first electrode 111 (FIG. 7B).

Then, an insulating film is formed by use of an organic material or an inorganic material so as to cover the second insulating film 107 and the first electrode 111. Then, the insulating film is processed so as to expose a part of the first electrode 111, thereby forming the partition wall 112. The partition wall 112 may be preferably formed by use of a photosensitive organic material (e.g., acrylic or polyimide); however, it may be formed by use of a non-photosensitive organic or inorganic material. End faces of the partition wall 112 in the direction of the first electrode 111 has a curvature, which desirably has a tapered shape with a continuously variable curvature (FIG. 7C).

Then, the light-emitting stack 113 is formed covering the first electrode 111 which is exposed from the partition wall 112. The light-emitting stack 113 may be formed by any method such as vapor deposition, ink-jetting and spin coating. Then, the second electrode 114 is formed covering the light-emitting stack 113. Accordingly, the light-emitting element 115 having the first electrode 111, the light-emitting stack 113 and the second electrode 114 can be manufactured (FIG. 7D).

In the display device of this embodiment mode having such a structure, light emitted from the light-emitting element 115 travels through the second insulating film 107, the first insulating film 106, the gate insulating film 104, the second base insulating film 102, the first base insulating film 101 and the substrate 100 before the light is emitted outside. Among them, the first insulating film 106 and the first base insulating film 101 have a large difference in refraction factor from the other films interposing the first insulating film 106 and the first base insulating film 101. In this embodiment mode, by setting each optical thickness L of the first insulating film 106 and the first base insulating film 101 to be substantially equal to the integral multiple of λ/2 on the assumption that the center wavelength of the light emitted from the light-emitting element 115 is λ, the light reflected on the incident interface of the films can be attenuated by the light reflected on the emission interface of the films, thus the reflected light generated by such films can be drastically decreased. The decrease of the reflected light can suppress the generation of the stationary wave which is caused by the mutual interference of the incident light and the reflected light, thereby degradation of the viewing angle characteristics caused by the stationary wave can be suppressed. In addition, a display device with improved viewing angle characteristics can be manufactured.

Subsequently, a silicon nitride film containing oxygen may be formed by plasma CVD to be used as a second passivation film. In the case of using the silicon nitride film containing oxygen, a film of $SiH_4$, $N_2O$ and $NH_3$ formed by plasma CVD, a film formed of $SiH_4$ and $N_2O$, or a film formed by use of a mixed gas of $SiH_4$ and $N_2O$ which is diluted with Ar may be used.

Alternatively, the second passivation film may be formed by use of a hydrogenated silicon oxide film containing nitrogen, which is formed of $SiH_4$, $N_2O$ and $H_2$. Needless to say, the second passivation film is not limited to a single-layer structure, and it may have a single-layer structure of an insulating film containing other kinds of silicon, or a stacked-layer structure. Alternatively, a multi-layer film of a carbon nitride film and a silicon nitride film, a multi-layer film of styrene polymer, a silicon nitride film, or a diamond-like carbon film may be used instead of the silicon oxide film containing nitrogen.

Subsequently, a display portion is sealed in order to protect the light-emitting element from substances such as moisture which would accelerate deterioration. In the case of using a counter substrate for sealing, it is stuck by use of an insulating sealant so that an external connecting portion is exposed. The space between the counter substrate and the element substrate may be filled with a dry inert gas such as nitrogen. Alternatively, the whole surface of the pixel portion may be coated with a sealant so as to function as the counter substrate. The sealant is preferably formed of an ultraviolet curable resin and the like. The sealant may be mixed with a drying agent or particles for maintaining gap constant. Subsequently, by attaching a flexible wiring substrate to the external connecting portion, the light-emitting device is completed.

Note that in the light-emitting device of the invention having a display portion, either an analog video signal or a digital video signal may be employed. The digital video signal can be classified into a video signal using voltage and a video signal using current. As a video signal inputted to a pixel during emission of a light-emitting element, there is a constant voltage video signal and a constant current video signal. The constant voltage video signal can be further classified into the one in which voltage applied to the light-emitting element is constant and the one in which current supplied to the light-emitting element is constant. Similarly, the constant current video signal can be classified into the one in which voltage applied to the light-emitting element is constant and the one in which current supplied to the light-emitting element is constant. The drive with the constant voltage applied to the light-emitting element is called a constant voltage drive, and the drive with the constant current supplied to the light-emitting element is called a constant current drive. In the constant current drive, constant current flows independently of the change in resistance of the light-emitting element. The light-emitting device and the driving method thereof of the invention may adopt any of the aforementioned driving methods.

Note that other structures of the invention shown in Embodiment Modes 1 to 5 may be easily obtained by those skilled in the art by appropriately changing the manufacturing process shown in this embodiment mode.

Embodiment Mode 10

Figure 8A:
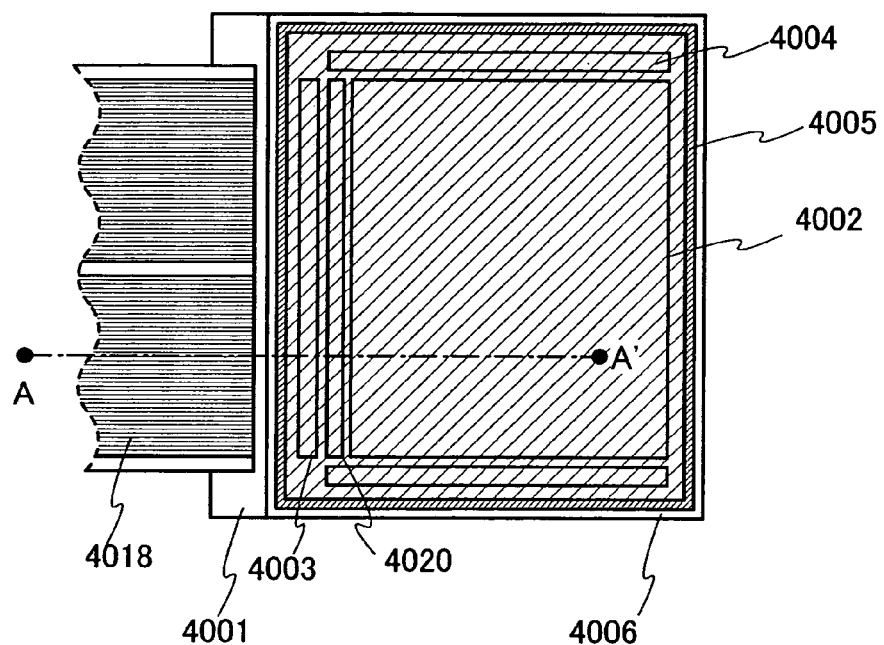
FIG. 8A is a top view of a display device of the invention and FIG. 8B is a sectional view thereof.
Figure 8B:
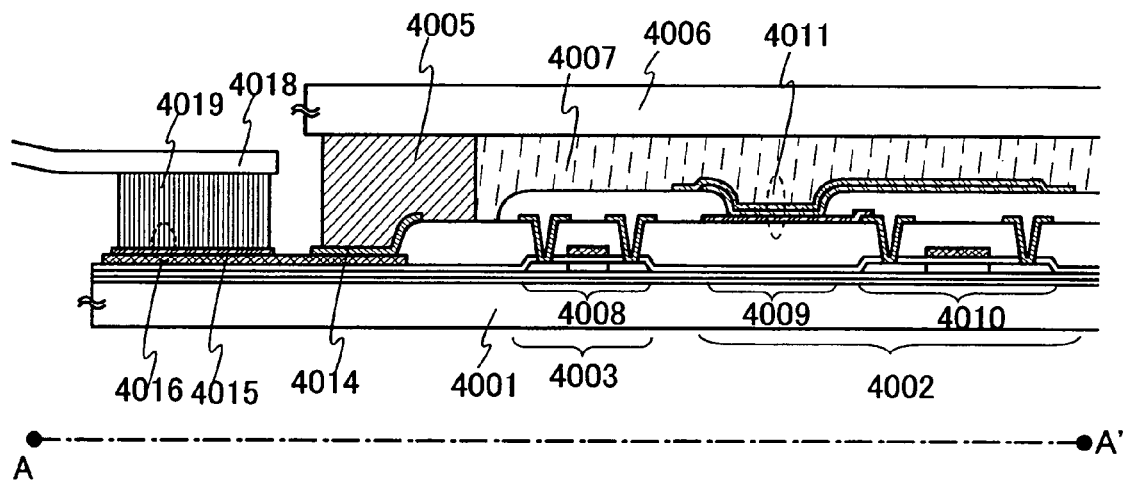

In this embodiment mode, description is made with reference to FIGS. 8A and 8B on an exterior view of a light-emitting device which corresponds to one mode of the invention. FIG. 8A is a top view of a panel which is obtained by sealing transistors and light-emitting elements formed over a substrate with a sealant provided between the substrate and a counter substrate 4006. FIG. 8B is a sectional view of FIG. 8A. The pixel portion of the panel has a structure shown in any of Embodiment Modes 1 to 5.

A sealant 4005 is provided so as to surround a pixel portion 4002, a signal line driver circuit 4003 and a scan line driver circuit 4004 which are provided over a substrate 4001. In addition, the counter substrate 4006 is provided over the pixel portion 4002, the signal line driver circuit 4003 and the scan line driver circuit 4004. The pixel portion 4002, the signal line driver circuit 4003 and the scan line driver circuit 4004 are tightly sealed with a filler 4007 by the substrate 4001, the sealant 4005 and the counter substrate 4006.

Each of the pixel portion 4002, the signal line driver circuit 4003 and the scan line driver circuit 4004 provided over the substrate 4001 has a plurality of thin film transistors. FIG. 8B illustrates a thin film transistor 4008 included in the signal line driver circuit 4003 and a thin film transistor 4010 included in the pixel portion 4002.

Reference numeral 4011 corresponds to a light-emitting element which is electrically connected to the thin film transistor 4010.

A lead wiring 4014 corresponds to a wiring for supplying signals or power supply voltages to the pixel portion 4002, the signal line driver circuit 4003 and the scan line driver circuit 4004. The lead wiring 4014 is connected to a connecting terminal 4016 through the lead wiring 4015. The connecting terminal 4016 is electrically connected to a terminal of a flexible printed circuit (FPC) 4018 via an anisotropic conductive film 4019.

Note that the filler 4007 can be formed by use of an ultraviolet curable resin or a heat curable resin as well as an inert gas such as nitrogen and argon. For example, polyvinyl chloride, acrylic, polyimide, epoxy resin, silicone resin, polyvinyl butyral or ethylene-vinyl acetate may be used.

Note that the display device of the invention includes a panel over which a pixel portion having light-emitting elements is formed, and a module which corresponds to the panel mounted with an IC.

According to the panel and the module shown in this embodiment mode, generation of the stationary wave, which is caused by the mutual interference of the incident light and the reflected light, can be suppressed until the light emitted from the light-emitting element 4011 is emitted to the outside of the display device. Therefore, degradation of the viewing angle characteristics caused by the stationary wave can be suppressed. In addition, a display device with improved viewing angle characteristics can be manufactured.

Embodiment Mode 11

As an electronic appliance of the invention mounted with a module as shown in the illustrative example in Embodiment Mode 10, there are a video camera, a digital camera, a goggle display (head mounted display), a navigation system, an audio reproducing device (e.g., car audio component set), a computer, a game machine, a portable information terminal (e.g., mobile computer, portable phone, portable game machine or electronic book), an image reproducing device provided with a recording medium (specifically, device for reproducing a recording medium such as a digital versatile disc (DVD), and having a display portion for displaying the reproduced image), and the like. FIGS. 9A to 9E illustrate specific examples of such electronic appliances.

FIG. 9A illustrates a light-emitting display device which corresponds to a television receiver, a monitor of a personal computer and the like. The light-emitting display device includes a housing 2001, a display portion 2003, a speaker portion 2004 and the like. According to the light-emitting display device of the invention, changes in emission spectrum, which are dependent on the angle seen from the emission side, are reduced, resulting in the superior display quality. In order to enhance the contrast, the pixel portion is preferably provided with a polarizing plate or a circular polarizing plate. For example, a counter substrate may be provided with a ¼λ film, a ½λ film and a polarizing film in this order. Further, an anti-reflection film may be provided over the polarizing films.

FIG. 9B illustrates a portable phone which includes a main body 2101, a housing 2102, a display portion 2103, an audio input portion 2104, an audio output portion 2105, an operating key 2106, an antenna 2108 and the like. According to the portable phone of the invention, changes in emission spectrum, which are dependent on the angle seen from the emission side, are reduced, resulting in the superior display quality.

FIG. 9C illustrates a computer which includes a main body 2201, a housing 2202, a display portion 2203, a keyboard 2204, an external connection port 2205, a pointing mouse 2206 and the like. According to the computer of the invention, changes in emission spectrum, which are dependent on the angle seen from the emission side, are reduced, resulting in the superior display quality. Although FIG. 9C illustrates a laptop computer, the invention can also be applied to a desktop computer in which a hard disk and a display portion are incorporated.

FIG. 9D illustrates a mobile computer which includes a main body 2301, a display portion 2302, a switch 2303, operating keys 2304, an IR port 2305 and the like. According to the mobile computer of the invention, changes in emission spectrum, which are dependent on the angle seen from the emission side, are reduced, resulting in the superior display quality.

FIG. 9E illustrates a portable game machine which includes a housing 2401, a display portion 2402, speaker portions 2403, operating keys 2404, an insert socket 2405 of recording media. According to the portable game machine of the invention, changes in emission spectrum, which are dependent on the angle seen from the emission side, are reduced, resulting in the superior display quality.

As set forth above, the scope of application of the invention is so wide that the invention can be applied to electronic appliances of various fields.

Embodiment Mode 12

In this embodiment mode, description is made on a specific structure of the light-emitting stack 113.

A light-emitting layer is formed of a light-emitting material and a substance having charge-injection/transport properties including an organic compound or an inorganic compound. The organic compound can be classified into, according to the number of molecules thereof, a low molecular weight organic compound, a medium molecular weight organic compound (corresponding to an organic compound having no sublimation properties, in which the number of molecules is 20 or less, or the length of the molecules connected in chain alignment is 10 μm or less), and a high molecular weight organic compound. The light-emitting layer includes one or more layers formed of such organic compound, which may also be combined with an inorganic compound having electron-injection/transport properties or hole-injection/transport properties.

As the substance having specifically superior electron-transport properties among the charge-injection/transport substances, there is a metal complex having quinoline or benzoquinoline skeleton such as tris(8-quinolinolato) aluminum (abbreviated to $Alq_3$), tris(4-methyl-8-quinolinolato) aluminum (abbreviated to $Almq_3$), bis(10-hydroxybenzo[h]-quinolinato)beryllium (abbreviated to $BeBq_2$), and bis (2-methyl-8-quinolinolato)-4-phenylphenolato-aluminum (abbreviated to BAlq). As the substance having superior hole-transport properties, for example, there is an aromatic amine compound (compound having benzene ring-nitrogen bonds) such as 4,4'-bis[N-(1-naphthyl)-N-phenyl-amino]-biphenyl (abbreviated to a-NPD), N,N'-bis(3-methylphenyl)-N,N'-diphenyl-1,1'-biphenyl-4,4'-diamine (abbreviated to TPD), 4,4',4"-tris(N,N-diphenyl-amino)-triphenylamine (abbreviated to TDATA), and 4,4',4"-tris[N-(3-methylphenyl)-N-phenyl-amino]-triphenylamine (abbreviated to MTDATA).

In addition, as the substance having the specifically superior electron-injection properties among the charge-injection/transport substances, there is a compound of alkaline metals or alkaline earth metals such as lithium fluoride (LiF), cesium fluoride (CsF), and calcium fluoride ($CaF_2$). Alternatively, a mixture of a substance having superior electron-transport properties such as $Alq_3$ and an alkaline earth metal such as magnesium (Mg) may be used.

As the substance having superior hole-injection properties among the charge-injection/transport substances, there is a metal oxide such as molybdenum oxide ($MoO_x$), vanadium oxide ($VO_x$), ruthenium oxide ($RuO_x$), tungsten oxide ($WO_x$), and manganese oxide ($MnO_x$). In addition, there is a phthalocyanine-based compound such as phthalocyanine (abbreviated to $H_2Pc$) and copper phthalocyanine (CuPC).

As the light-emitting layer, a structure for performing color display may be employed by forming a light-emitting layer having a different emission spectrum in each pixel. Typically, a light-emitting layer corresponding to each color of R (red), G (green) and B (blue) is formed. In this case also, color purity can be improved as well as the mirror-like surface (glare) of the pixel portion can be prevented by adopting a structure where a filter (colored layer) for transmitting light with the emission spectrum is provided on the emission side of the pixel. By providing the filter (colored layer), a circular polarizing plate and the like which have been conventionally required can be omitted, which can recover loss of the light emitted from the light-emitting layer. Further, changes in color tone, which are recognized when the pixel portion (display screen) is seen obliquely, can be reduced.

As the light-emitting material, various materials can be used. As the low molecular weight organic light-emitting material, there are 4-dicyanomethylene-2-methyl-6-[2-(1,1,7,7-tetramethyljulolidine-9-yl)ethenyl]-4H-pyran (abbreviated to DCJT), 4-dicyanomethylene-2-t-butyl-6-[2-(1,1,7,7-tetramethyljulolidine-9-yl)ethenyl]-4H-pyran (abbreviated to DCJTB), periflanthene, 2,5-dicyano-1,4-bis[2-(10-methoxy-1,1,7,7-tetramethyljulolidine-9-yl)ethenyl]benzene, N,N'-dimethyl quinacridone (abbreviated to DMQd), Coumalin 6, Coumarin 545T, tris(8-quinolinolato) aluminum (abbreviated to $Alq_3$), 9,9'-bianthryl, 9,10-diphenylanthracene (abbreviated to DPA), and 9,10-di(2-naphthyl)anthracene (abbreviated to DNA). Alternatively, other substances may be employed.

On the other hand, the high molecular weight organic light-emitting material has higher physical strength as compared to the low molecular weight organic light-emitting material, and thus is highly durable. In addition, since the material can be deposited by coating, manufacture of the element can be relatively facilitated. The light-emitting element using the high molecular weight organic light-emitting material has basically the same structure as the light-emitting element using the low molecular weight organic light-emitting material, in which a cathode, an organic light-emitting layer and an anode are stacked in this order over the semiconductor layer. However, in manufacture of the light-emitting layer using the high molecular weight organic light-emitting material, it is difficult to form a stacked-layer structure similarly to the light-emitting layer using the low molecular weight organic light-emitting material; therefore, a bi-layer structure is often adopted. Specifically, the structure that a cathode, a light-emitting layer, a hole-transport layer and an anode are stacked in this order over the semiconductor layer is adopted.

The emission color is determined by the material for forming the light-emitting layer; therefore, by selecting the material, a light-emitting element exhibiting desired luminance can be formed. As the high molecular weight organic light-emitting material which can be used for forming the light-emitting layer, there is a polyparaphenylene vinylene, polyparaphenylene, polythiophene or polyfluorene-based compound.

As the polyparaphenylene vinylene-based compound, there are derivatives of poly(paraphenylene vinylene) [PPV], poly(2,5-dialkoxy-1,4-phenylene vinylene [RO-PPV], poly[2-(2'-ethylhexoxy)-5-methoxy-1,4-phenylene vinylene [MEH-PPV], poly(2-(dialkoxyphenyl)-1,4-phenylene vinylene [ROPh-PPV], and the like. As the polyparaphenylene-based compound, there are derivatives of polyparaphenylene [PPP], poly(2,5-dialkoxy-1,4-phenylene)[RO-PPP], poly(2,5-dihexoxy-1,4-phenylene), and the like. As the polythiophene-based compound, there are derivatives of polythiophene [PT], poly(3-alkylthiophene) [PAT], poly(3-hexylthiophene) [PHT], poly(3-cyclohexylthiophene) [PCHT], poly(3-cyclohexyl-4-methylthiophene) [PCHMT], poly(3,4-dicyclohexylthiophene) [PDCHT], poly[3-(4-octylphenyl)-thiophene] [POPT], poly[3-(4-octylphenyl)-2,2-bithiophene] [PTOPT], and the like. As the polyfluorene-based compound, there are derivatives of polyfluorene [PF], poly(9,9-dialkylfluorene) [PDAF], poly(9,9-diochtylfluorene) [PDOF], and the like.

Note that the hole-injection properties from the anode can be improved if the high molecular weight organic light-emitting material with hole-transport properties is formed to be interposed between the anode and the high molecular weight organic light-emitting material. In general, the material dissolved in water with an acceptor material is applied by spin coating. In addition, since the material is insoluble in organic solvent, it can be stacked with the aforementioned organic light-emitting material. As the high molecular weight organic light-emitting material with hole-transport properties, there are a mixture of PEDOT and camphorsulfonic acid (CSA) as an acceptor material, a mixture of polyaniline [PANI], polystyrenesulphonic [PSS] as an acceptor material, and the like.

The light-emitting layer can be formed to have a structure to emit monochromatic light or white light. In the case of using a white-light-emitting material, color display can be achieved by adopting the structure where a filter (colored layer) for transmitting light with a specific wavelength is provided on the emission side of the pixel.

In order to form a light-emitting layer to emit white light, for example, white emission can be obtained by sequentially stacking $Alq_3$ which is partially doped with Nile Red as a red emission material, $Alq_3$, p-EtTAZ, and TPD (aromatic diamine) by vapor deposition. In addition, in the case of forming an EL layer by coating using a spin coater, the EL layer is desirably baked by vacuum heating after the coating. For example, the whole surface is coated with aqueous solution of poly(3,4-ethylenedioxythiophene)/poly(styrenesulfonate) (PEDOT/PSS) which functions as a hole-injection layer, and then baked. Subsequently, the whole surface is coated with polyvinylcarbazole (PVK) solution doped with a luminescence center pigment (e.g., 1,1,4,4-tetraphenyl-1,3-butadiene (TPB), 4-(dicyano-methylene)-2-methyl-6-(p-dimethylaminostyryl)-4H-pyran (DCM1), Nile Red, Coumarin 6, and the like) which functions as a light-emitting layer.

The light-emitting layer may be formed in a single layer, and it may be formed by use of polyvinylcarbazole (PVK) having hole-transport properties dispersed with 1,3,4-oxadiazole derivatives (PBD) having electron transport properties. In addition, by dispersing 30 wt % of PBD as an electron-transport agent, and further dispersing four kinds of pigments (TPB, Coumarin 6, DCM1 and Nile Red) in appropriate quantities, white emission can be obtained. Not only the light-emitting element which provides white emission shown herein, but also a light-emitting element which provides red, green or blue emission can be manufactured by appropriately selecting the material for the light-emitting layer.

Note that the hole-injection properties from the anode can be improved if the high molecular weight organic light-emitting material with hole-transport properties is formed to be interposed between the anode and the high molecular weight organic light-emitting material. In general, the material dissolved in water with an acceptor material is applied by spin coating. In addition, since the material is insoluble in organic solvent, it can be stacked with the aforementioned organic light-emitting material. As the high molecular weight organic light-emitting material with hole-transport properties, there are a mixture of PEDOT and camphorsulfonic acid (CSA) as an acceptor material, a mixture of polyaniline [PANI], polystyrenesulphonic [PSS] as an acceptor material, and the like.

Further, the light-emitting layer may be formed by use of a material for emission that is obtained from a singlet excitation (hereinafter referred to as a singlet excitation light-emitting material), or a material for emission that is obtained from a triplet excitation (hereinafter referred to as a triplet excitation light-emitting material) including a metal complex. For example, among light-emitting pixels for red emission, green emission and blue emission, the light-emitting pixel for red emission, which has a relatively short luminance half decay period (time until which the luminance decays to the half level of its original value), is formed by use of a triplet excitation light-emitting material while the other light-emitting pixels are formed by use of a singlet excitation light-emitting material. The triplet excitation light-emitting material has high luminous efficiency, which is advantageous in that lower power consumption is required even for obtaining the same luminance. That is, when the triplet excitation light-emitting material is applied to the red pixel, the amount of current supplied to the light-emitting element can be suppressed, resulting in improvement in reliability. Alternatively, the light-emitting pixels for red emission and green emission may be formed by use of a triplet excitation light-emitting material while the light-emitting element for blue emission may be formed by use of a singlet excitation light-emitting material. When forming the light-emitting element for green emission that is highly visible to human eyes by use of the triplet excitation light-emitting material, even lower power consumption can be achieved.

As an example of the triplet excitation light-emitting material, there is the one using a metal complex as a dopant, which includes a metal complex having, as a central metal, platinum that is a third transition element, and a metal complex having iridium as a central metal, and the like. The triplet excitation light-emitting material is not limited to the aforementioned compounds, and it may be a compound having elements of groups 8 to 10 in the periodic table as a central metal.

The aforementioned substances for forming the light-emitting layer are only examples, and a light-emitting element can be formed by appropriately stacking each functional layer such as a hole-injection/transport layer, a hole-transport layer, an electron-injection/transport layer, an electron-transport layer, a light-emitting layer, an electron-blocking layer and a hole-blocking layer. In addition, a mixed-layer or mixed-junction structure combining such layers may be employed. The layer structure of the light-emitting layer may be changed, and the modification is possible without departing the broader spirit of the invention such that no specific electron-injection region or light-emitting region is provided but an alternative electrode for this purpose is provided or a light-emitting material is dispersed.

The light-emitting element formed by use of the aforementioned materials emits light when it is applied with a forward bias. Pixels of a display device formed with light-emitting elements may be driven by a passive matrix method or an active matrix method. In either case, the individual pixel is controlled to emit light by being applied with a forward bias at specific timing, and it is controlled to emit no light in a certain period. By applying a reverse bias in the non-emission period, reliability of the light-emitting elements can be improved. As degradation modes of the light-emitting elements, there is a degradation that the luminance intensity is decreased under the constant drive conditions, or a degradation that apparent luminance is decreased due to the non-emission region increased in the pixels. For this, by performing AC drive in which a forward or reverse bias is applied, degradation speed can be retarded, resulting in improvement of reliability of the light-emitting device.

Embodiment Mode 13

In this embodiment mode, description is made on a pixel circuit included in the panel or the module shown in Embodiment Mode 10, a protection circuit and operation thereof. Note that sectional diagrams heretofore shown in FIGS. 1 to 7 are the sectional diagrams of a driving TFT 1403 and a light-emitting element 1405.

Figure 10A:
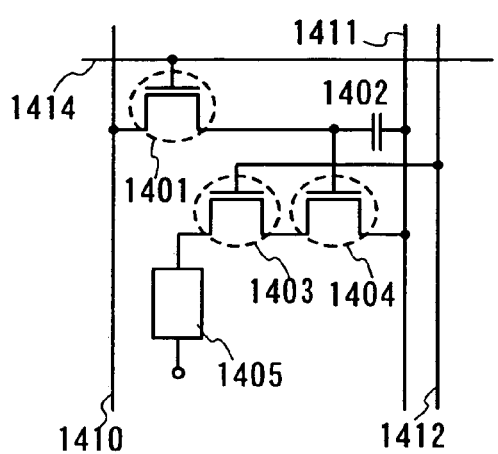
FIGS. 10A to 10F are circuit diagrams of a pixel circuit used in a display device of the invention.

The pixel shown in FIG. 10A includes a signal line 1410 and power supply lines 1411 and 1412 disposed in columns, and a scan line 1414 disposed in rows. The pixel also includes a switching TFT 1401, the driving TFT 1403, a current-controlling TFT 1404, a capacitor 1402 and the light-emitting element 1405.

Figure 10B:
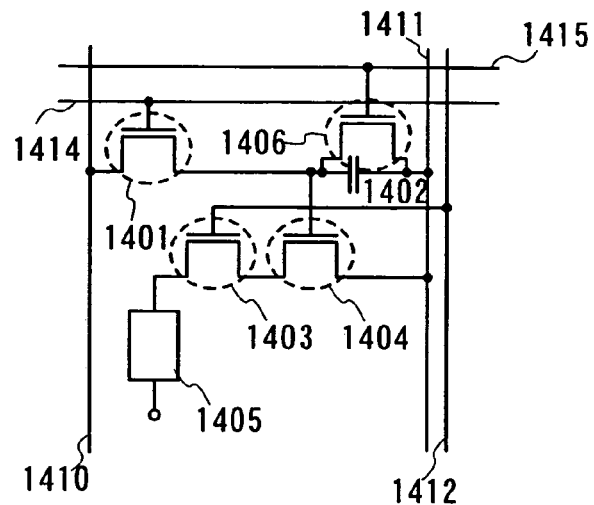
Figure 10C:
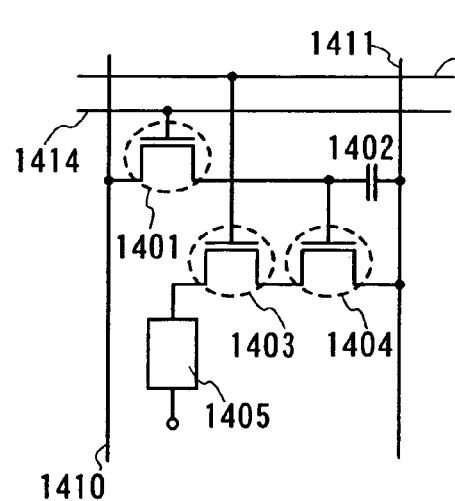
Figure 10D:
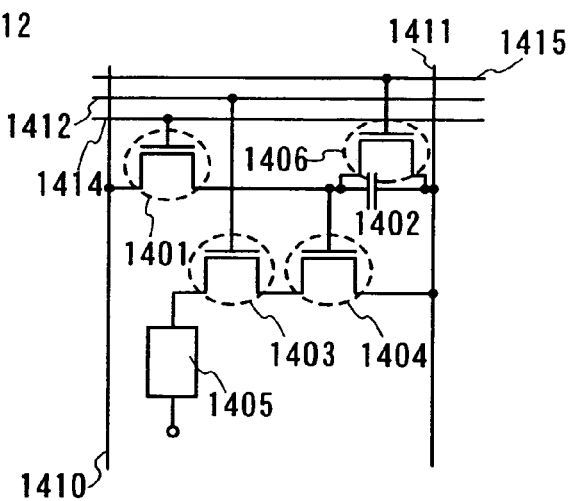

The pixel shown in FIG. 10C is different from FIG. 10A in that the gate electrode of the driving TFT 1403 is connected to the power supply line 1412 disposed in rows, and configuration other than this is the same as FIG. 10A. That is, the pixels shown in FIGS. 10A and 10C are equivalent circuit diagrams of each other. However, the power supply line 1412 is formed of a conductive film of different layers between the case where the power supply line 1412 is disposed in columns (FIG. 10A) and the case where the power supply line 1412 is disposed in rows (FIG. 10C). Here, a wiring to which the gate electrode of the driving TFT 1403 is connected is focused on, and the description is made with reference to FIGS. 10A and 10C in order to show the difference of layers for forming the respective wirings.

In the pixels shown in FIGS. 10A and 10C, the driving TFT 1403 and the current-controlling TFT 1404 are connected in series. It is desirable that the channel length L(1403) and the channel width W(1403) of the driving TFT 1403, and the channel length L(1404) and the channel width W(1404) of the current-controlling TFT 1404 be set to satisfy L(1403)/W(1403): L(1404)/W(1404)=5 to 6000: 1.

Note that the driving TFT 1403 operates in the saturation region, and functions to control the current value supplied to the light-emitting element 1405 while the current-controlling TFT 1404 operates in the linear region, and functions to control the current supply to the light-emitting element 1405. Both of the TFTs preferably have the same conductivity in view of the manufacturing steps, and in this embodiment mode, N-channel TFTs are employed. In addition, the driving TFT 1403 may be either an enhancement mode TFT or a depletion mode TFT. According to the invention having the aforementioned configuration, the current-controlling TFT 1404 operates in the linear region; therefore, slight fluctuation of Vgs of the current-controlling TFT 1404 does not affect the current value of the light-emitting element 1405. That is, the current value of the light-emitting element 1405 can be determined by the driving TFT 1403 which operates in the saturation region. According to such a configuration, luminance unevenness of light-emitting elements resulting from the characteristic variations of TFTs can be improved, thereby a display device with improved image quality can be provided.

In the pixels shown in FIGS. 10A to 10D, the switching TFT 1401 controls a video signal input to each pixel. When the switching TFT 1401 is turned ON, a video signal is inputted to the pixel. Then, a voltage of the video signal is held in the capacitor 1402. Note that FIGS. 10A and 10C show the configurations provided with the capacitor 1402; however, the invention is not limited to them, and the capacitor 1402 may be omitted if the gate capacitance and the like can function as a capacitor for holding video signals.

The pixel shown in FIG. 10B has the same configuration as the pixel shown in FIG. 10A except that a TFT 1406 and the scan line 1414 are additionally provided. Similarly, the pixel shown in FIG. 10D has the same configuration as the pixel shown in FIG. 10C except that the TFT 1406 and the scan line 1414 are additionally provided.

ON/OFF of the TFT 1406 is controlled by the scan line 1414 additionally provided. When the TFT 1406 is turned ON, charges held in the capacitor 1402 are released, thereby the current-controlling TFT 1404 is turned OFF. That is, the provision of the TFT 1406 can forcibly provide the state where no current is supplied to the light-emitting element 1405. Therefore, the TFT 1406 can be called an erasing TFT. Thus, in the configurations in FIGS. 10B and 10D, emission period can start simultaneously with or immediately after the writing period without awaiting the signal input to the whole pixels, which can improve the duty ratio.

Figure 10E:
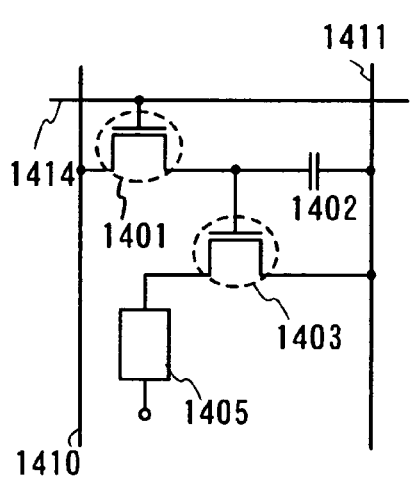
Figure 10F:
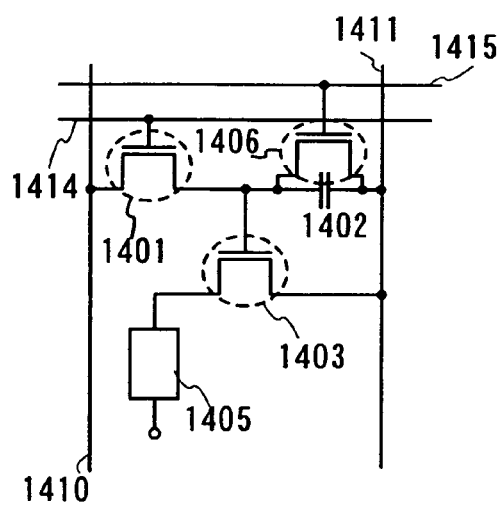

In the pixel shown in FIG. 10E, the signal line 1410 and the power supply line 1411 are disposed in columns, and the scan line 1414 is disposed in rows. In addition, the pixel includes the switching TFT 1401, the driving TFT 1403, the capacitor 1402 and the light-emitting element 1405. The pixel shown in FIG 10F has the same configuration as the pixel shown in FIG. 10E except that the TFT 1406 and the scan line 1415 are additionally provided. Note that in the configuration shown in FIG. 10F also, the provision of the TFT 1406 can improve the duty ratio.

As set forth above, various pixel circuits can be adopted. In addition, when forming thin film transistors using amorphous semiconductor films, the semiconductor film of a driving TFT is preferably formed large. Therefore, in the aforementioned pixel circuits, a top emission structure is preferably employed where light emitted from the electroluminescent layer is outputted in the direction of the sealing substrate.

Such an active matrix light-emitting device is considered to be advantageous in that it can be driven with low voltage when the pixel density thereof is increased since TFTs are provided in each pixel.

In this embodiment mode, description is made on the active matrix light-emitting device where TFTs are provided in each pixel; however, a passive matrix light-emitting device where TFTs are provided for each column can be formed as well. The passive matrix light-emitting device has a high aperture ratio since TFTs are not provided in each pixel. In the case of a light-emitting device where light is emitted to both sides of the electroluminescent layer, transmissivity can be increased when the passive matrix display device is employed.

According to the display device of the invention which has such pixel circuits, superior viewing angle characteristics can be provided as well as the superior characteristics of thin film transistors; therefore, the display can be provided with each of the characteristics.

Subsequently, description is made with reference to the equivalent circuit diagram in FIG. 11 in the case where diodes are provided as protective circuits in the scan line and the signal line.

Figure 11:
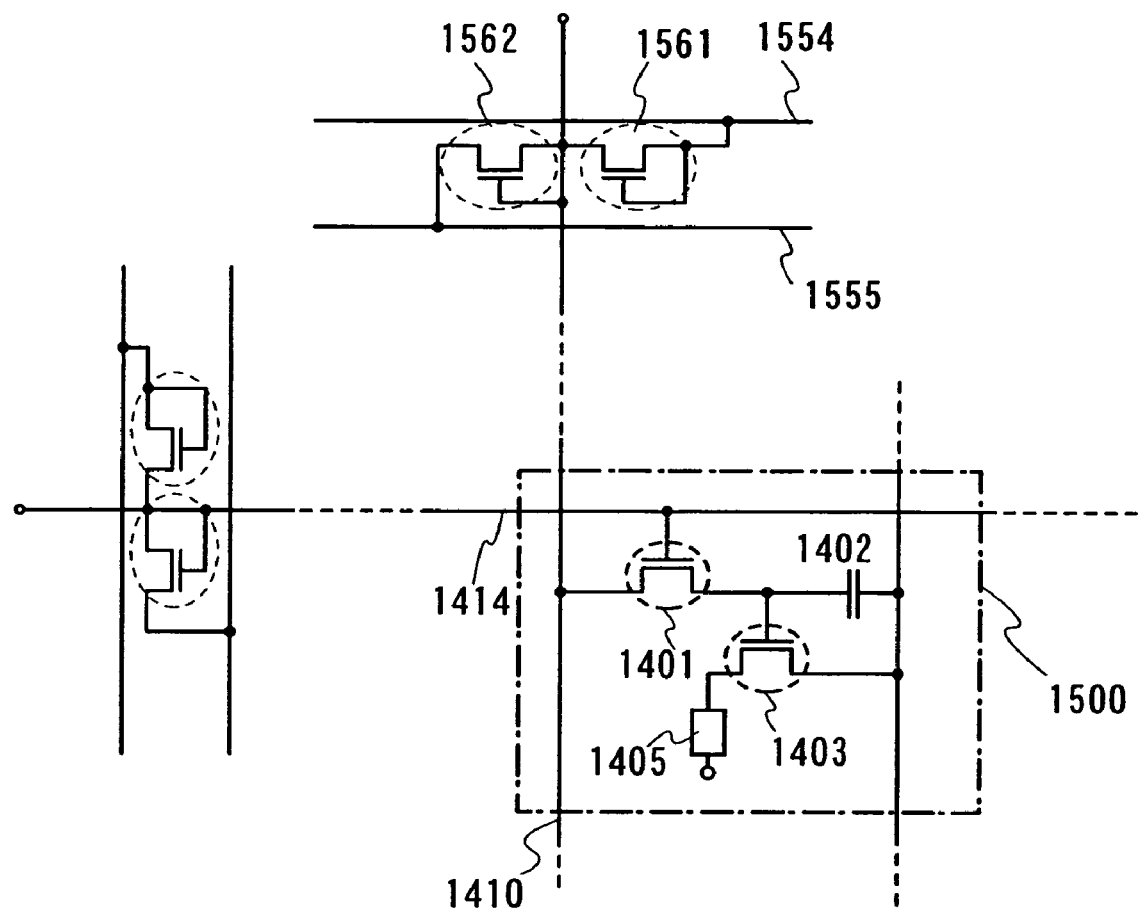
FIG. 11 is a circuit diagram of a protection circuit used in a display device of the invention.

In FIG. 11, the switching TFTs 1401 and 1403, the capacitor 1402, and the light-emitting element 1405 are provided in a pixel portion 1500. In the signal line 1410, diodes 1561 and 1562 are provided. Each of the diodes 1561 and 1562 is manufactured similarly to the switching TFT 1401 or 1403 based on the aforementioned embodiment mode, and it has a gate electrode, a semiconductor layer, a source electrode, a drain electrode and the like. The diodes 1561 and 1562 each functions as a diode by connecting the gate electrode to the drain electrode or the source electrode.

Common potential lines 1554 and 1555 which are connected to the respective diodes are formed of the same layer as the gate electrodes. Thus, in order to connect the common potential lines 1554 and 1555 to the source electrodes or the drain electrodes of the diodes respectively, a contact hole is required to be formed in the gate insulating film.

Diodes provided in the scan line 1414 have a similar configuration.

In this manner, according to the invention, protective diodes provided at the input stage can be formed simultaneously. Note that the position for forming the protective diodes is not limited to this, and the diodes may be provided between the driver circuit and the pixel.

According to the display device of the invention having such a protective circuit, superior viewing angle characteristics can be provided as well as the superior characteristics of thin film transistors, thus the reliability of the display device can be increased as well.

Embodiment 1

In this embodiment mode, description is made with reference to FIGS. 14A and 14B on the measurement result of the viewing angle characteristics of the display device of the invention using two types of light-emitting elements having DMQd (green) and DNA (blue) as the luminescence center. In this embodiment, measurement was carried out on elements each having the structure shown in Embodiment Mode 1. In both elements, the physical thickness of a film (corresponding to the first base insulating film 101 and the first insulating film 106 shown in Embodiment Mode 1) is set to 130 nm, and the total physical thickness of films (corresponding to the second base insulating film 102 and the gate insulating film 104) is set to 150 nm.

As a comparative example, for both of the light-emitting elements using DMQd (green) and DNA (blue) respectively, the physical thickness of the first base insulating film 101 is set to 50 nm, the physical thickness of the first insulating film 106 is set to 100 nm, and the total physical thickness of the second base insulating film 102 and the gate insulating film 104 is set to 150 nm.

FIG. 14A illustrates an example where a display device using DMQd (green) as the luminescence center is measured while FIG. 14B illustrates an example where a display device using DNA (blue) as the luminescence center is measured. In ideal states in both examples, only the luminance intensity is decreased when the viewing angle changes, without the spectral shape changed. However, in the comparative example, the spectral shape changes largely depending on the viewing angle; thus, the viewing angle characteristics are not superior. However, in the structure of this embodiment, there is no change in the spectral shape depending on the viewing angle, which largely contributes to the improvement in viewing angle characteristics as compared to the comparative example.

In this manner, in a display device having the structure of the invention, by controlling the thickness of a film having a large difference in refraction factor from the other films interposing the film, through which light emitted from a light-emitting element travels to the outside, to have a specific thickness, reflection of light can be suppressed, which is generated in traveling through the film having the large difference in refraction factor. Accordingly, the generation of the stationary wave, which is caused by the mutual interference of the reflected light and incident light, can be suppressed, thereby viewing angle characteristics can be improved. Accordingly, a display device capable of performing a favorable image display can be provided with improved viewing angle characteristics.

The present application is based on Japanese Priority application No. 2004-188827 filed on Jun. 25, 2004 with the Japanese Patent Office, the entire contents of which are hereby incorporated by reference.

What is claimed is:

1. A display device comprising:
   a substrate;
   a thin film transistor including a semiconductor layer formed over the substrate;

a wiring electrically connected to the semiconductor layer;
a light-emitting element comprising:
   a first electrode electrically connected to the wiring;
   a light emitting layer over the first electrode; and
   a second electrode over the light emitting layer, and
a plurality of layers formed between the substrate and the light-emitting element, including:
   a first layer having a refraction factor n1,
   a second layer over the first layer, having a refraction factor n2, and
   a third layer over the second layer, having a refraction factor n3,
wherein n1<n2>n3,
wherein an optical thickness of the second layer is substantially equal to the integral multiple of $\lambda/2$, and
wherein a center wavelength of a light emitted from the light-emitting element is $\lambda$.

2. The display device according to claim 1, wherein the first layer has substantially the same refraction factor as the third layer.

3. The display device according to claim 1, wherein the first layer has the same refraction factor as the third layer.

4. The display device according to claim 1, wherein the first layer is formed of the same material as the third layer.

5. A display device according to claim 1 wherein the display device is comprised in one selected from the group consisting of a video camera, a digital camera, a goggle display, a navigation system, an audio reproducing device, a computer, a game machine, a portable information terminal, and an image reproducing device provided with a recording medium.

6. A display device comprising:
a substrate;
a thin film transistor including a semiconductor layer formed over the substrate;
a wiring electrically connected to the semiconductor layer;
a light-emitting element comprising:
   a first electrode electrically connected to the wiring;
   a light emitting layer over the first electrode; and
   a second electrode over the light emitting layer, and
a plurality of layers formed between the substrate and the light-emitting element, including:
   a first layer having a refraction factor n1,
   a second layer over the first layer, having a refraction factor n2, and
   a third layer over the second layer, having a refraction factor n3,
wherein n1>n2<n3,
wherein an optical thickness of the second layer is substantially equal to the integral multiple of $\lambda/2$, and
wherein a center wavelength of a light emitted from the light-emitting element is $\lambda$.

7. The display device according to claim 6, wherein the first layer has substantially the same refraction factor as the third layer.

8. The display device according to claim 6, wherein the first layer has the same refraction factor as the third layer.

9. The display device according to claim 6, wherein the first layer is formed of the same material as the third layer.

10. A display device according to claim 6 wherein the display device is comprised in one selected from the group consisting of a video camera, a digital camera, a goggle display, a navigation system, an audio reproducing device, a computer, a game machine, a portable information terminal, and an image reproducing device provided with a recording medium.

11. A display device comprising:
a substrate;
a first base insulating film over the substrate;
a second base insulating film over the first base insulating film;
a thin film transistor including a semiconductor layer over the second base insulating film;
a first insulating film over the thin film transistor;
a second insulating film over the first insulating film;
a wiring formed over the second insulating film and electrically connected to the semiconductor layer through a contact hole; and
a light-emitting element comprising:
   a first electrode electrically connected to the wiring;
   a light emitting layer over the first electrode; and
   a second electrode over the light emitting layer,
wherein the first electrode transmits light,
wherein the first base insulating film has a larger refraction factor than the substrate and than the second base insulating film,
wherein the first insulating film has a larger refraction factor than the second insulating film and than the second base insulating film,
wherein each optical thickness of the first base insulating film and the first insulating film is substantially equal to the integral multiple of $\lambda/2$, and
wherein a center wavelength of the light emitted from the light-emitting element is $\lambda$.

12. A display device according to claim 11 wherein the display device is comprised in one selected from the group consisting of a video camera, a digital camera, a goggle display, a navigation system, an audio reproducing device, a computer, a game machine, a portable information terminal, and an image reproducing device provided with a recording medium.

13. A display device comprising:
a substrate;
a first base insulating film over the substrate;
a second base insulating film over the first base insulating film;
a thin film transistor including a semiconductor layer over the second base insulating film;
a first insulating film over the thin film transistor;
a second insulating film over the first insulating film;
a wiring formed over the second insulating film and electrically connected to the semiconductor layer through a contact hole; and
a light-emitting element comprising:
   a first electrode electrically connected to the wiring;
   a light emitting layer over the first electrode; and
   a second electrode over the light emitting layer,
wherein the first electrode transmits light,
wherein the first base insulating film has a smaller refraction factor than the substrate and than the second base insulating film,
wherein the first insulating film has a smaller refraction factor than the second insulating film and than the second base insulating film,
wherein each optical thickness of the first base insulating film and the first insulating film is substantially equal to the integral multiple of $\lambda/2$, and
wherein a center wavelength of the light emitted from the light-emitting element is $\lambda$.

14. A display device according to claim 13 wherein the display device is comprised in one selected from the group consisting of a video camera, a digital camera, a goggle display, a navigation system, an audio reproducing device, a computer, a game machine, a portable information terminal and an image reproducing device provided with a recording medium.

15. A display device comprising:
a substrate;
a first base insulating film over the substrate;
a second base insulating film over the first base insulating film;
a thin film transistor over the second base insulating film, including:
a semiconductor layer,
a gate insulating film adjacent to the semiconductor layer, and
a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the first base insulating film has a larger refraction factor than the substrate and than the second base insulating film,
wherein the first insulating film has a larger refraction factor than the second insulating film and than the gate insulating film,
wherein a total optical thickness of the second base insulating film and the gate insulating film is $L1$,
wherein each optical thickness of the first base insulating film and the first insulating film is $L2$,
wherein m is an integer not less than 1,
wherein $L1=-L2+(2m-1)\lambda/4$ is substantially satisfied, and
wherein a center wavelength of the light emitted from the light-emitting element is $\lambda$.

16. A display device according to claim 15 wherein the display device is comprised in one selected from the group consisting of a video camera, a digital camera, a goggle display, a navigation system, an audio reproducing device, a computer, a game machine, a portable information terminal and an image reproducing device provided with a recording medium.

17. A display device comprising:
a substrate;
a first base insulating film over the substrate;
a second base insulating film over the first base insulating film;
a thin film transistor over the second base insulating film, including:
a semiconductor layer,
a gate insulating film adjacent to the semiconductor layer, and
a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the first base insulating film has a smaller refraction factor than the substrate and than the second base insulating film,
wherein the first insulating film has a smaller refraction factor than the second insulating film and than the gate insulating film,
wherein a total optical thickness of the second base insulating film and the gate insulating film is $L1$,
wherein each optical thickness of the first base insulating film and the first insulating film is $L2$,
wherein m is an integer not less than 1,
wherein $L1=-L2+(2m-1)\lambda/4$ is substantially satisfied, and
wherein a center wavelength of the light emitted from the light-emitting element is $\lambda$.

18. A display device according to claim 17 wherein the display device is comprised in one selected from the group consisting of a video camera, a digital camera, a goggle display, a navigation system, an audio reproducing device, a computer, a game machine, a portable information terminal, and an image reproducing device provided with a recording medium.

19. A display device comprising:
a substrate;
a first base insulating film over the substrate;
a second base insulating film over the first base insulating film;
a thin film transistor over the second base insulating film, including:
a semiconductor layer,
a gate insulating film adjacent to the semiconductor layer, and
a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein a total optical thickness of the second base insulating film and the gate insulating film is $L1$,
wherein each optical thickness of the first base insulating film and the first insulating film is $L2$,
wherein m is an integer not less than 1,
wherein $L1=-L2+(2m-1)\lambda/4$ is substantially satisfied,
wherein a center wavelength of the light emitted from the light-emitting element is $\lambda$,
wherein a physical thickness of the first base insulating film is in the range of 120 to 162 nm,
wherein a physical thickness of the first insulating film is in the range of 120 to 162 nm, and
wherein a total physical thickness of the gate insulating film and the second base insulating film is in the range of 132 to 198 nm.

20. A display device according to claim 19 wherein the display device is comprised in one selected from the group consisting of a video camera, a digital camera, a goggle display, a navigation system, an audio reproducing device, a computer, a game machine, a portable information terminal, and an image reproducing device provided with a recording medium.

21. A display device comprising:
a substrate;
a first base insulating film over the substrate;
a second base insulating film over the first base insulating film;
a thin film transistor including a semiconductor layer over the second base insulating film;
an insulating film over the thin film transistor;
a wiring formed over the insulating film and electrically connected to the semiconductor layer through a contact hole; and
a light-emitting element comprising:
  a first electrode electrically connected to the wiring;
  a light emitting layer over the first electrode; and
  a second electrode over the light emitting layer,
wherein the first electrode transmits light,
wherein the first base insulating film has a larger refraction factor than the substrate and than the second base insulating film,
wherein an optical thickness of the first base insulating film is substantially equal to the integral multiple of $\lambda/2$, and
wherein a center wavelength of the light emitted from the light-emitting element is $\lambda$.

22. A display device according to claim 21 wherein the display device is comprised in one selected from the group consisting of a video camera, a digital camera, a goggle display, a navigation system, an audio reproducing device, a computer, a game machine, a portable information terminal and an image reproducing device provided with a recording medium.

23. A display device comprising:
a substrate;
a first base insulating film over the substrate;
a second base insulating film over the first base insulating film;
a thin film transistor including a semiconductor layer over the second base insulating film;
an insulating film over the thin film transistor;
a wiring formed over the insulating film and electrically connected to the semiconductor layer through a contact hole; and
a light-emitting element comprising:
  a first electrode electrically connected to the wiring;
  a light emitting layer over the first electrode; and
  a second electrode over the light emitting layer,
wherein the first electrode transmits light,
wherein the first base insulating film has a smaller refraction factor than the substrate and than the second base insulating film,
wherein an optical thickness of the first base insulating film is substantially equal to the integral multiple of $\lambda/2$, and
wherein a center wavelength of the light emitted from the light-emitting element is $\lambda$.

24. A display device according to claim 23 wherein the display device is comprised in one selected from the group consisting of a video camera, a digital camera, a goggle display, a navigation system, an audio reproducing device, a computer, a game machine, a portable information terminal and an image reproducing device provided with a recording medium.

25. A display device comprising:
a substrate;
a base insulating film over the substrate;
a thin film transistor over the base insulating film, including:
  a semiconductor layer,
  a gate insulating film adjacent to the semiconductor layer, and
  a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
  a first electrode electrically connected to the wiring;
  a light emitting layer over the first electrode; and
  a second electrode over the light emitting layer,
wherein the first electrode transmits light,
wherein the base insulating film has a larger refraction factor than the substrate and than the gate insulating film,
wherein the first insulating film has a larger refraction factor than the second insulating film and than the gate insulating film,
wherein each optical thickness of the base insulating film and the first insulating film is substantially equal to the integral multiple of $\lambda/2$, and
wherein a center wavelength of the light emitted from the light-emitting element is $\lambda$.

26. A display device according to claim 25 wherein the display device is comprised in one selected from the group consisting of a video camera, a digital camera, a goggle display, a navigation system, an audio reproducing device, a computer, a game machine, a portable information terminal, and an image reproducing device provided with a recording medium.

27. A display device comprising:
a substrate;
a base insulating film over the substrate;
a thin film transistor over the base insulating film, including:
  a semiconductor layer,
  a gate insulating film adjacent to the semiconductor layer, and
  a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
  a first electrode electrically connected to the wiring;
  a light emitting layer over the first electrode; and
  a second electrode over the light emitting layer,
wherein the first electrode transmits light,
wherein the base insulating film has a smaller refraction factor than the substrate and than the gate insulating film,
wherein the first insulating film has a smaller refraction factor than the second insulating film and than the gate insulating film,
wherein each optical thickness of the base insulating film and the first insulating film is substantially equal to the integral multiple of $\lambda/2$, and
wherein a center wavelength of the light emitted from the light-emitting element is $\lambda$.

28. A display device according to claim 27 wherein the display device is comprised in one selected from the group consisting of a video camera, a digital camera, a goggle display, a navigation system, an audio reproducing device, a computer, a game machine, a portable information terminal, and an image reproducing device provided with a recording medium.

29. A display device comprising:
a substrate;
a base insulating film over the substrate;
a thin film transistor including a semiconductor layer over the base insulating film;
an insulating film over the thin film transistor;
a wiring formed over the insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the base insulating film has a larger refraction factor than the substrate and than the insulating film,
wherein an optical thickness of the base insulating film is substantially equal to the integral multiple of $\lambda/2$, and
wherein a center wavelength of the light emitted from the light-emitting element is $\lambda$.

30. A display device according to claim 29 wherein the display device is comprised in one selected from the group consisting of a video camera, a digital camera, a goggle display, a navigation system, an audio reproducing device, a computer, a game machine, a portable information terminal, and an image reproducing device provided with a recording medium.

31. A display device comprising:
a substrate;
a base insulating film over the substrate;
a thin film transistor including a semiconductor layer over the base insulating film;
an insulating film over the thin film transistor;
a wiring formed over the insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the base insulating film has a smaller refraction factor than the substrate and than the insulating film,
wherein an optical thickness of the base insulating film is substantially equal to the integral multiple of $\lambda/2$, and
wherein a center wavelength of the light emitted from the light-emitting element is $\lambda$.

32. A display device according to claim 31 wherein the display device is comprised in one selected from the group consisting of a video camera, a digital camera, a goggle display, a navigation system, an audio reproducing device, a computer, a game machine, a portable information terminal, and an image reproducing device provided with a recording medium.

33. A display device comprising:
a substrate;
a base insulating film over the substrate;
a thin film transistor including a semiconductor layer over the base insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the first insulating film has a larger refraction factor than the second insulating film and than the base insulating film,
wherein an optical thickness of the first insulating film is substantially equal to the integral multiple of $\lambda/2$, and
wherein a center wavelength of the light emitted from the light-emitting element is $\lambda$.

34. A display device according to claim 33 wherein the display device is comprised in one selected from the group consisting of a video camera, a digital camera, a goggle display, a navigation system, an audio reproducing device, a computer, a game machine, a portable information terminal and an image reproducing device provided with a recording medium.

35. A display device comprising:
a substrate;
a base insulating film over the substrate;
a thin film transistor including a semiconductor layer over the base insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the first insulating film has a smaller refraction factor than the second insulating film and than the base insulating film,
wherein an optical thickness of the first insulating film is substantially equal to the integral multiple of $\lambda/2$, and
wherein a center wavelength of the light emitted from the light-emitting element is $\lambda$.

36. A display device according to claim 35 wherein the display device is comprised in one selected from the group consisting of a video camera, a digital camera, a goggle display, a navigation system, an audio reproducing device, a computer, a game machine, a portable information terminal, and an image reproducing device provided with a recording medium.

37. A display device comprising:
a substrate;
a first base insulating film over the substrate;
a second base insulating film over the first base insulating film;
a thin film transistor over the second base insulating film, including:
a semiconductor layer,
a gate insulating film adjacent to the semiconductor layer, and
a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and a second electrode over the light emitting layer,
wherein the first electrode transmits light,
wherein the second base insulating film, the gate insulating film, and the first insulating film are optically one layer,
wherein the optically one layer has a larger refraction factor than the second insulating film and than the first base insulating film,
wherein an optical thickness of the optically one layer is substantially equal to the integral multiple of $\lambda/2$, and
wherein a center wavelength of the light emitted from the light-emitting element is $\lambda$.

38. A display device according to claim 37 wherein the display device is comprised in one selected from the group consisting of a video camera, a digital camera, a goggle display, a navigation system, an audio reproducing device, a computer, a game machine, a portable information terminal and an image reproducing device provided with a recording medium.

39. A display device comprising:
a substrate;
a first base insulating film over the substrate;
a second base insulating film over the first base insulating film;
a thin film transistor over the second base insulating film, including:
a semiconductor layer,
a gate insulating film adjacent to the semiconductor layer, and
a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein the second base insulating film, the gate insulating film, and the first insulating film are optically one layer,
wherein the optically one layer has a smaller refraction factor than the second insulating film and than the first base insulating film,
wherein an optical thickness of the optically one layer is substantially equal to the integral multiple of $\lambda/2$, and
wherein a center wavelength of the light emitted from the light-emitting element is $\lambda$.

40. A display device according to claim 39 wherein the display device is comprised in one selected from the group consisting of a video camera, a digital camera, a goggle display, a navigation system, an audio reproducing device, a computer, a game machine, a portable information terminal and an image reproducing device provided with a recording medium.

41. A display device comprising:
a substrate;
a first base insulating film over the substrate;
a second base insulating film over the first base insulating film;
a thin film transistor over the second base insulating film, including:
a semiconductor layer,
a gate insulating film adjacent to the semiconductor layer, and
a gate electrode adjacent to the gate insulating film;
a first insulating film over the thin film transistor;
a second insulating film over the first insulating film;
a wiring formed over the second insulating film and electrically connected to the semiconductor layer through a contact hole; and
a light-emitting element comprising:
a first electrode electrically connected to the wiring;
a light emitting layer over the first electrode; and
a second electrode over the light emitting layer,
wherein the first electrode transmits light,
wherein a physical thickness of the first base insulating film is in the range of 120 to 162 nm,
wherein a physical thickness of the second insulating film is in the range of 120 to 162 nm,
wherein the second base insulating film, the gate insulating film, and the first insulating film are optically one layer,
wherein an optical thickness of the optically one layer is substantially equal to the integral multiple of $\lambda/2$, and
wherein a center wavelength of the light emitted from the light-emitting element is $\lambda$.

42. A display device according to claim 41 wherein the display device is comprised in one selected from the group consisting of a video camera, a digital camera, a goggle display, a navigation system, an audio reproducing device, a computer, a game machine, a portable information terminal, and an image reproducing device provided with a recording medium.

* * * * *